United States Patent
Lee et al.

(10) Patent No.: US 10,475,549 B2
(45) Date of Patent: Nov. 12, 2019

(54) STRUCTURE INCLUDING MOLECULAR MONOLAYER AND GRAPHENE ELECTRODE, FLEXIBLE ELECTRONIC DEVICE, AND METHOD OF PRODUCING THE SAME

(71) Applicant: RESEARCH & BUSINESS FOUNDATION SUNGKYUNKWAN UNIVERSITY, Suwon-si (KR)

(72) Inventors: Hyoyoung Lee, Suwon-si (KR); Sohyeon Seo, Jeonju-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 557 days.

(21) Appl. No.: 14/287,680

(22) Filed: May 27, 2014

(65) Prior Publication Data

US 2015/0129280 A1    May 14, 2015

(30) Foreign Application Priority Data

Nov. 12, 2013    (KR) ........................ 10-2013-0137140

(51) Int. Cl.
| | |
|---|---|
| *H01B 1/04* | (2006.01) |
| *H01L 29/16* | (2006.01) |
| *G03F 7/016* | (2006.01) |
| *G03C 1/54* | (2006.01) |
| *G03C 1/52* | (2006.01) |

(52) U.S. Cl.
CPC ................ *H01B 1/04* (2013.01); *G03C 1/52* (2013.01); *G03C 1/54* (2013.01); *G03F 7/016* (2013.01); *H01L 29/1606* (2013.01)

(58) Field of Classification Search
CPC .... H01B 1/04; H01M 4/133; H01M 8/04216; H01M 10/0525; G03C 1/54; G03C 1/52; G03F 7/016; H01L 29/1606; H01L 31/04; B82Y 40/00; B82Y 30/00; Y02P 70/56
See application file for complete search history.

(56) References Cited

U.S. PATENT DOCUMENTS

| | | | |
|---|---|---|---|
| 2011/0068290 A1* | 3/2011 | Haddon | ............... C12Q 1/6881 252/62.51 R |
| 2014/0107326 A1* | 4/2014 | Swager | .................. B82Y 30/00 534/558 |

(Continued)

FOREIGN PATENT DOCUMENTS

KR    10-2010-0016928 A    2/2010

OTHER PUBLICATIONS

Gooding, Justin J., Advances in Interfacial Design for Electrochemical Biosensors and Sensors: Aryl Diazonium Salts for Modifying Carbon and Metal Electrodes, 2007, Electroanalysis, 20, No. 6, 573-582.*

(Continued)

*Primary Examiner* — Eli D. Strah
(74) *Attorney, Agent, or Firm* — NSIP Law

(57) ABSTRACT

A structure including a graphene electrode and a molecular monolayer, a flexible electronic device, and a method of production thereof are provided. The structure includes a first graphene electrode and a molecular monolayer disposed on the first graphene electrode and chemically or physically bound to the first graphene electrode.

19 Claims, 31 Drawing Sheets

(56) References Cited

U.S. PATENT DOCUMENTS

2014/0212760 A1* 7/2014 Zhao .................. H01M 4/0419
429/231.8
2016/0104852 A1* 4/2016 Sato .................. H01L 29/42312
257/27

OTHER PUBLICATIONS

Paulus et al., Covalent Electron Transfer Chemistry of Graphene with Diazonium Salts, Sep. 2012, Accounts of Chemical Research, vol. 46, No. 1, 160-170.*

Li, X. et al., Transfer of large-area graphene films for high-performance transparent conductive electrodes, Nano Lett. 9, 4359-4363, (2009).*

Seo et al., Photo-switchable molecular monolayer anchored between highly transparent and flexible graphene electrodes, May 28, 2013, Nature Communications, DOI: 10.1038/ncomms2937, 1-7.*

Min et al., Voltage-Controlled Nonvolatile Molecular Memory of an Azobenzene Monolayer through Solution-Processed Reduced Graphene Oxide Contacts, Oct. 17, 2013, Advanced Materials, vol. 25, Issue 48, 7045-7050.*

Kim, Sung, et al., Graphene p-n Vertical Tunneling Diodes, May 21, 2013, ACSNANO, vol. 7, No. 6, 5168-5174.*

Novoselov, Kostya S., et al. "Electric field effect in atomically thin carbon films." Science vol. 306 (2004): 666-669.

Seo, Sohyeon, et al. "Photo-switchable molecular monolayer anchored between highly transparent and flexible graphene electrodes." Nature Communications (2013): 1-7.

Lee, Hyoyoung. "Molecular Memory through Solution-Processed Graphene Electrodes." *IDC-NICE* (2013). (4 pages).

Min, Misook, et al. "Voltage-Controlled Nonvolatile Molecular Memory of an Azobenzene Monolayer through Solution-Processed Reduced Graphene Oxide Contacts." Advanced Materials (2013). (7 pages).

Min, Misook, et al. "A photoswitchable methylene-spaced fluorinated aryl azobenzene monolayer grafted on silicon." Chemical Communications 46.29 (2010) (4 pages).

* cited by examiner

STRUCTURE INCLUDING MOLECULAR MONOLAYER AND GRAPHENE ELECTRODE, FLEXIBLE ELECTRONIC DEVICE, AND METHOD OF PRODUCING THE SAME

CROSS-REFERENCE TO RELATED APPLICATION

This application claims the benefit under 35 USC 119(a) of Korean Patent Application No. 10-2013-0137140 filed on Nov. 12, 2013, in the Korean Intellectual Property Office, the entire disclosure of which is incorporated herein by reference for all purposes.

BACKGROUND

1. Field

The following description relates to a structure comprising a graphene electrode and a molecular thin film, a molecular monolayer device, a flexible electronic device including a graphene electrode and a molecular thin film, and a method of producing the same.

2. Description of Related Art

Graphene refers to a carbon-based material having a structure of a two-dimensional nano-sheet monolayer, in which $sp^2$ hybridized carbon atoms form a hexagonal honeycomb lattice. Graphene was first discovered in 2004 by a British research team led by Novoselov and Geim from graphite through mechanical exfoliation [Novoselov K et al., Electric field effect in atomically thin carbon films, *Science*, 306:666, 2004]. As a crystalline allotrope of carbon, graphene has been spotlighted as a groundbreaking material by virtue of its significantly high specific surface area with a theoretical value of 2,600 $m^2/g$, superior electronic conduction property, and physical and chemical stability (typical value of $8\times10^5$ S/cm from the view point of quantum mechanics). Graphene has been considered for applicability in energy storage materials, such as lithium ion secondary cells, hydrogen storage fuel cells, and super capacitors, for various devices based on nano-complexation with a transition metal, gas sensors, micro-components for medical engineering, high functional composites, and so on.

One of the goals of molecule-based organic electronics is the realization of molecular functionalities in miniaturized and flexible electronic devices. Over the last few decades, numerous molecules have been suggested as viable candidates for such applications due to their electronically active or passive properties at the nanometer scale. Fabrication processes for soft and stable contact to single molecules or molecular monolayers, and reliable measurements of the electronic properties of molecules, have been investigated. Recently, stabilized fabrication methods using soft conducting layers were developed for device miniaturization using molecules. Miniaturization using molecules has also been explored via microscopic and spectroscopic studies of single molecules and molecular monolayers. The desirable organic electrode is one that is conductive, flexible and transparent, forms ideal contacts to a molecular monolayer of a organic molecule in a two-terminal crossbar device and is ultimately compatible with current standard electronic circuitry. To date, however, such characteristics have not been reported for molecular monolayer-integrated transparent and flexible electronics.

In this regard, Korean Patent Application Publication No. 10-2010-0016928 relates to a graphene nanostructure solution and a method of preparing a graphene device, and describes a graphene nanodevice, in which graphene nanostructures are arranged in a second area of a substrate, on which no hydrophobic molecular film is formed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a structure includes a first graphene electrode, a second graphene electrode disposed apart from the first graphene electrode, and a molecular monolayer disposed between the first graphene electrode and the second graphene electrode, in which the first graphene electrode is chemically or physically bonded with the molecular monolayer, and the second graphene electrode is chemically or physically bonded with the molecular monolayer.

The molecular monolayer may be formed from an organic molecule including an aryl diazonium-based cation.

The molecular monolayer may be chemically or physically bonded with the first graphene electrode via a covalent bond and may be chemically or physically bonded with the second graphene electrode via a physical contact.

The aryl diazonium-based cation may have a formula of $R-N_2^+$ or $N_2^+-R^1-R^2-N_2^+$, wherein each of R, $R^1$ and $R^2$ independently includes -1-aryl-alkyl, -1-aryl-alkenyl, -1-aryl-alkynyl, -1-aryl-X-alkyl, -1-aryl-X-alkenyl, -1-aryl-X-alkynyl, or -1-aryl wherein X is O, S or —NH, wherein the other end of R of the formula of $R-N_2^+$ in the aryl diazonium-based cation has a substituent selected from the group consisting of H, —OH, —$NH_2$, —SH and an azo group.

The first graphene electrode or the second graphene electrode may include a graphene prepared by a chemical vapor deposition, a spin-coating method, or a dipping method, or a reduced graphene oxide prepared by a solution-phase process.

In another general aspect, a flexible electronic device includes a structure described above.

In yet another general aspect, a method of preparing a structure involves forming a molecular monolayer by self-assembly on a first graphene electrode, in which the first graphene electrode is chemically or physically bonded with the self-assembled monolayer.

The general aspect of the method may further involve forming a second graphene electrode on the molecular monolayer, in which the second graphene electrode is chemically or physically bonded with the self-assembled monolayer.

The first graphene electrode or the second graphene electrode may include a graphene prepared by a chemical vapor deposition, a spin-coating method, or a dipping method, or a reduced graphene oxide prepared by a solution-phase process.

The molecular monolayer may be formed from an organic molecule including an aryl diazonium-based cation.

The forming of the molecular monolayer by self-assembly may involve forming a covalent bond between one end of an organic molecule comprising an aryl diazonium-based cation and the first graphene electrode, in which the second graphene electrode is chemically or physically bonded with the self-assembled monolayer by a physical contact.

In another general aspect, a structure may include a first graphene electrode, and a molecular monolayer disposed on the first graphene electrode and chemically or physically bound to the first graphene electrode.

The structure may further include a second graphene electrode disposed on the molecular monolayer and chemically or physically bound to the molecular monolayer.

The molecular monolayer may be chemically or physically bound to the first graphene electrode via a covalent bond, and chemically or physically bound to the second graphene electrode via an intermolecular interaction between the second graphene electrode and the molecular monolayer.

The molecular monolayer may include an aryl diazonium-based cation

The diazonium substituent may have a formula of R—$N_2^+$ or $N_2^+$—$R^1$—$R^2$—$N_2^+$, wherein each of R, $R^1$ and $R^2$ independently includes -1-aryl-alkyl, -1-aryl-alkenyl, -1-aryl-alkynyl, -1-aryl-X-alkyl, -1-aryl-X-alkenyl, -1-aryl-X-alkynyl, or -1-aryl wherein X is O, S or NH, wherein the other end of R of the formula of R—$N_2^+$ in the aryl diazonium-based cation has a substituent selected from the group consisting of H, —OH, —$NH_2$, —SH and an azo group.

Other features and aspects will be apparent from the following detailed description, the drawings, and the claims.

Figure 1:
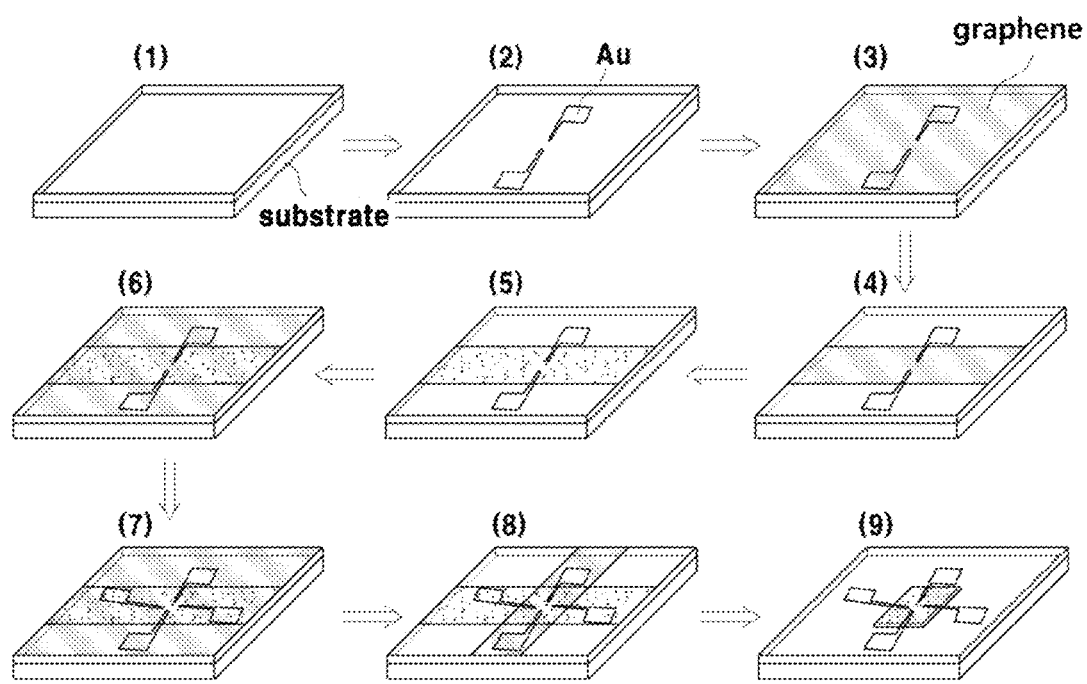
FIG. 1 is a schematic diagram illustrating an example of a method of preparing a device using a graphene electrode-molecular thin film hybrid structure.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the disclosure, the phrase "connected to" or "coupled to" are used to designate a connection or coupling of one element to another element and include both an example in which an element is "directly connected or coupled to" another element and an example in which an element is "electronically connected or coupled to" another element via still another element.

The term "on" that is used to designate a position of one element with respect to another element includes both an example in which the one element is adjacent to the another element and an example in which any other element exists between these two elements.

The expression "comprises/" "includes/" "comprising" or "including" as used in the disclosure does not exclude one or more other components, steps, operations, or the existence or addition of elements in addition to the described components, steps, operations and/or elements. Throughout the disclosure, the terms "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for."

The term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

The description "A and/or B" means "A or B, or A and B."

The term "graphene" means that multiple carbon atoms are bonded to one another through covalent bond, thereby forming polycyclic aromatic molecules, and the carbon atoms bonded through the covalent bond form a six-membered ring as a basic repeat unit, but may further include five- and/or seven-membered rings. Accordingly, a sheet formed of the graphene appears to be a monolayer of the covalently bonded carbon atoms, but may not be limited thereto. The sheet formed of the graphene may have various structures, and the structures may vary depending on a content of the five- and/or seven-membered rings that may be contained in the graphene. Furthermore, if the sheet formed of the graphene is a monolayer, it may be stacked on one another thereby forming multiple layers, and a side end part of the graphene sheet may be saturated with hydrogen atoms, but may not be limited thereto.

Hereinafter, example embodiments are described in detail, but the present disclosure may not be limited thereto.

In accordance with an example embodiment, there is provided a graphene electrode-molecular thin film hybrid structure, which includes a self-assembled monolayer formed between a first graphene electrode and a second graphene electrode, and in which the first graphene electrode is chemically or physically bonded with the self-assembled monolayer, and the second graphene electrode is chemically or physically bonded with the self-assembled monolayer.

In accordance with the present example embodiment, graphene, a single layer of carbon atoms, forms ideal electric contacts via formation of carbon-carbon bonding to organic molecules, and thus, graphene electrodes can be used as materials for flexible electronic devices. As an intrinsically transparent, conductive, and flexible electrode that allows for a photoswitchable molecular device, two-dimensional (2D) graphene is much more compatible with a complementary metal-oxide semiconductor (CMOS) technology in comparison to other conductive carbon materials such as, for example, one-dimensional carbon nanotubes or zero-dimensional fullerenes. The graphene electrode can provide a chemically applicable surface to form a molecular monolayer of molecules specified with an electrophilic group. For example, graphene, as a building block on a surface, allows for the one-sided grafting of organic molecules containing aryl diazonium-based cations via a well-known dediazoniation process for $sp^2$-carbon network materials. This process is one of a few chemical reactions used to functionalize the graphene basal plane. The organic molecules containing aryl diazonium-based cations spontaneously and thermally generate active aromatic radicals that create a carbon-carbon bond on the graphene surface. A large-area uniform molecular monolayer is subsequently formed.

In accordance with the present example embodiment, for two-terminal crossbar molecular devices, chemically grafting (or assembly) molecules on graphene electrode surfaces can result in a large contact area in the form of a molecular monolayer and can amplify the signal of specific activities on the molecular scale. At the same time, the other side of the molecular monolayer is physically contacted to the graphene electrode. For example, for a two-terminal, transparent and flexible graphene-based vertical molecular device, a aryl molecular monolayer tunnel junction may be formed between two graphene electrodes, but the present disclosure may not be limited thereto.

In general, chemical bonding is bonding between atoms or molecules and forms strong bonding while creating new atoms or molecules. The chemical bonding may involve the formation of a covalent bond. If the graphene electrode and one side of the molecular monolayer have a chemical bonding, logical movement of the molecules can be prevented. In addition, if the graphene electrode and the other side of the molecular monolayer have a physical bonding, the device can have high flexibility against mechanical stress such as bending or twisting. In accordance with the present example embodiment, the molecular monolayer may be formed from organic molecules containing aryl diazonium-based cations, but may not be limited thereto. For example, the aryl diazonium-based cation may have a formula of R—$N_2^+$ or $N_2^+$—$R^1$—$R^2$—$N_2^+$, wherein each of R, $R^1$ and $R^2$ independently includes -1-aryl-alkyl, -1-aryl-alkenyl, -1-aryl-alkynyl, -1-aryl-X-alkyl, -1-aryl-X-alkenyl, -1-aryl-X-alkynyl, or -1-aryl wherein X is O, S or —NH, wherein the other end of R of the formula of R—$N_2^+$ in the aryl diazonium-based cation has a substituent selected from the group consisting of H, —OH, —$NH_2$, —SH and an azo group. In the above aryl diazonium-based cation, the aryl has $C_6$ to $C_{42}$, the alkyl is a liner or branched alkyl having $C_1$ to $C_{20}$; the alkenyl is a linear or branched alkenyl having $C_2$ to $C_{20}$; the alkynyl is a liner or branched alkynyl having $C_2$ to $C_{20}$; the aryl can be derived from naphthalene, anthracene, pyrene, coronene, rubrene, graphene quantum dots or graphene.

In one embodiment, the aryl diazonium-based cation may have a formula of $N_2^+$—$R^1$—$R^2$—$N_2^+$ can be used for each end of the molecular monolayer to be chemically bonded to the first electrode and the second electrode.

In one embodiment, the aryl diazonium-based cation may comprise an aryl diazonium cation selected from the group consisting of a 1-phenylalkane diazonium cation ($N_2^+$-Ph-$C_nH_{2n+1}$), a 1-phenylalkene diazonium cation ($N_2^+$-Ph-$C_nH_{2n-1}$), a 1-phenylalkyne diazonium cation ($N_2^+$-Ph-$C_nH_{2n-3}$), a 1-aryl diazonium cation ($N_2^+$-aryl compound) in which the aryl is derived from naphthalene, anthracene, pyrene, coronene, rubrene, graphene quantum dots or graphene and the aryl has a substituent which is selected from the group consisting of —OH, —$NH_2$, —SH and an azo group linked to the other end of the 1-aryl diazonium cation, and combinations thereof.

In accordance with the present example embodiment, aryl diazonium-based cations may be produced from an aryl diazonium-based salt containing aryl diazonium-based cations within an aqueous solution while being separated from anions, and the aryl diazonium-based salt may be presented by Formula 1 or 2 below; however, the present disclosure may not be limited thereto.

[Formula 1]

wherein n is an integer selected from 1 to 13, and $X^-$ is $Cl^-$, $BF_4^-$, $PF_6^-$, $AsF_6^-$, $SbF_6^-$, or $CF_3SO_3^-$.

[Formula 2]

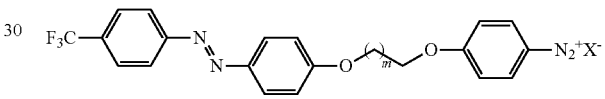

wherein m is an integer selected from 1 to 13, and $X^-$ is $Cl^-$, $BF_4^-$, $PF_6^-$, $AsF_6^-$, $SbF_6^-$, or $CF_3SO_3^-$.

In accordance with the present example embodiment, the aryl diazonium-based cations may include diazonium-based cations selected from the group consisting of aryl alkane diazonium cations ($N_2^+$—ArC1~C14), aryl alkane azobenzene diazonium cations ($N_2^+$—ArC1~C14AB) [Ar refers to an aryl group, and AB refers to azobenzene], and combinations thereof, but not limited thereto.

For example, the aryl diazonium-based cations may include diazonium-based cations selected from the group consisting of 1-phenyloctane diazonium cations ($N_2^+$-PhC8), 1-phenyldecane diazonium cations ($N_2^+$-PhC10), 1-phenyldodecane diazonium cations ($N_2^+$-PhC12), 1-phenyldecaneazobenzene diazonium cations ($N_2^+$-PhC10AB), and combinations thereof, but not limited thereto. Through electrophilic diazonium reactions, the band structures of the graphene electrodes are modulated such that covalent C—C $sp^3$ bonds form between the aryl radicals and C=C $sp^2$ carbon atoms. The organic molecules containing aryl diazonium-based cations can generate active aromatic radicals that create a carbon-carbon bond on the graphene surface so as to produce a large contact area in the form of the molecular monolayer between the graphene electrodes. The organic molecules containing aryl diazonium-based cations can induce effective doping on the graphene electrodes as the molecular length is short.

In accordance with the present example embodiment, with respect to a method for forming the self-assembled monolayer, any method known in the art of the present disclosure can be used without limitation. For example, the organic molecules containing aryl diazonium-based cations may be self-assembled on the graphene electrodes of the substrate under an inert condition via a dipping method; however, the present disclosure is not limited thereto.

In accordance with the present example embodiment, the first and/or second graphene electrodes may include a graphene material prepared by a chemical vapor deposition, a spin-coating, or a dipping method, or a reduced graphene oxide formed by a solution-phase process; however, the method for preparing the graphene material for the graphene electrodes is not limited thereto.

In accordance with the present example embodiment, with respect to a specific method for the chemical vapor deposition, the spin-coating or the dipping method, any method commonly used in the art of the present disclosure may be used without limitation.

For example, the chemical vapor deposition deposits a product, which has been produced by reacting a source material in the gas state on a heated substrate surface, on the substrate surface. The chemical vapor deposition method is widely used because it can deposit a thin film on a large area at a rapid speed, in comparison to the physical vapor deposition method. Further, the chemical vapor deposition method does not require a vacuum condition upon deposition. However, the present disclosure not limited thereto.

The reduced graphene oxide is a monolayer $sp^2$-carbon atom sheet, which is electronically compatible with graphene and completely dispersed in a solution so as to have the semiconductor characteristic of high conductivity. Due to these characteristics, a graphene electrode formed by a chemical vapor deposition process is compatible with a reduced graphene oxide electrode formed by a solution-phase process; further, the reduced graphene oxide can be subject to the solution-phase process. For example, the reduced graphene oxide electrode may be prepared by spray-coating a graphene oxide solution on a substrate for deposition of a graphene oxide, and then, reducing the graphene oxide by exposure to reductant vapor; however, the present disclosure is not limited thereto.

In accordance with another example embodiment, there is provided a flexible electronic device including a graphene electrode-molecular thin film hybrid structure according to the above-described example embodiment.

In accordance with the present example embodiment, a graphene electrode provides a chemically applicable surface to form a molecular monolayer of molecules specified with an electrophilic group so that a flexible electronic device beyond conventional Si substrate- or metal electrode-based devices can be prepared. For example, by using a dediazoniation process, it is possible to prepare a graphene electrode-molecule thin film hybrid structure including a molecular monolayer formed from organic molecules specified with an electrophilic group and containing diazonium-based cations on graphene, and the flexible electronic device including the graphene electrode-molecular thin film hybrid structure; however, the present disclosure is not limited thereto. The graphene electrode-molecular thin film hybrid structure forms a chemically stable, optically transparent, mechanically flexible, and molecularly compatible junction, and thereby, allowing for the realization of superior stable, transparent, and flexible electronic devices.

In accordance with the present example embodiment, the flexible electronic device may include a photo-switchable molecular monolayer or a voltage-switchable molecular monolayer with one side chemically and the other side physically anchored between two graphene electrodes, but may not be limited thereto.

In accordance with still another example embodiment, there is provided a preparing method of a graphene electrode-molecular thin film hybrid structure, which includes forming a molecular monolayer by self-assembly on a first graphene electrode; and forming a second graphene electrode on the molecular monolayer, and in which the first graphene electrode is chemically or physically bonded with the self-assembled monolayer, and the second graphene electrode is chemically or physically bonded with the self-assembled monolayer.

FIG. 1 is a schematic diagram illustrating an example of a method of preparing a molecular monolayer device. According to the illustrated example, the molecular monolayer device is a molecular monolayer-based vertical tunneling device including two graphene electrodes on a flexible substrate. Referring to FIG. 1, the method of preparing a molecular monolayer involves: (1) preparing a substrate; (2) depositing lower AU leads; (3) transferring a first graphene electrode; (4) etching the first graphene electrode; (5) self-assembly of the molecular monolayer; (6) transferring a second graphene electrode; (7) depositing upper Au leads; (8) etching the second graphene electrode; and (9) graphene etching on the Au leads.

In accordance with the present example embodiment, with respect to the graphene used for the first and second graphene electrodes, any graphene prepared by using a method known in the art of the present disclosure may be used without limitation.

In accordance with the present example embodiment, with respect to a type of the substrate and a method of preparing the substrate, any type and method used in the art of the present disclosure may be used without limitation. The substrate may include, for example, flexible substrates such as polydimethylsiloxane (PDMS), polyethylene terephthalate (PET), polyimide (PI) and polyethylene naphthalate (PEN), but may not be limited thereto. The method of preparing the substrate may involve spin-coating a PDMS substrate on a PET substrate (hereinafter, the "PDMS/PET substrates"), but the method is not limited thereto. In the event that a PDMS substrate is applied to the PET substrate, the surface roughness of the substrate is reduced, in comparison to a bare PET substrate. As a result, the device yield may be increased. For example, the device yield of a PDMS device is approximately 80% to 90%, while the device yield of a PET substrate device is approximately 40% to 50%. According to one example, in order to construct graphene-based molecular junctions, the PDMS/PET substrates may be patterned with Au leads by e-beam evaporation before transferring the graphene electrode onto the PDMS/PET substrates. However, the present disclosure is not limited thereto.

In accordance with the present example embodiment, the first and/or second graphene electrodes may include a graphene prepared by a chemical vapor deposition method, a spin-coating method, or a dipping method, or a reduced graphene oxide formed by a solution-phase process; but the material for the graphene electrodes are not limited thereto.

In accordance with the present example embodiment, the graphene production method is not limited to a specific type of the chemical vapor deposition method, spin coating method, or dipping method. A graphene electrode formed by a chemical vapor deposition method is compatible with a reduced graphene oxide electrode formed by a solution-phase process, and a reduced graphene oxide can be subject to a solution-phase process.

In accordance with the present example embodiment, the molecular monolayer may be formed from organic molecules containing aryl diazonium-based cations, but the material is not limited thereto.

Hereinafter, the example embodiments are described by using Examples. The Examples are provided for illustrative purposes for furthering understanding of the present disclosure, and the present disclosure is not limited to the Examples.

EXAMPLES

<Preparation of Aryl Diazonium Salts>

Figure 2:
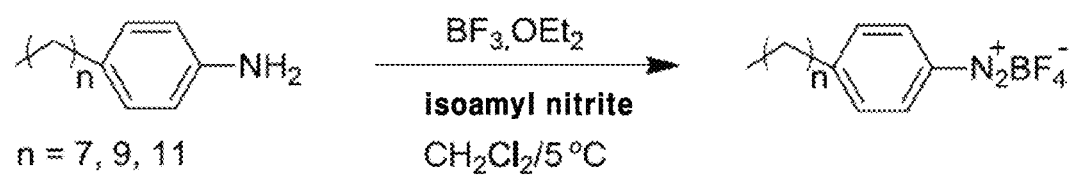
FIG. 2 is a chemical reaction used to synthesize 4-octyl-benzenediazonium tetrafluoroborate (n=7), 4-decyl-benzenediazonium tetrafluoroborate (n=9), and 4-dodecyl-benzenediazonium tetrafluoroborate (n=11) according to an example of a method of preparing a device.

Aryl diazonium salts [4-alkyl (e.g., octyl, decyl, and dodecyl)-benzenediazonium tetrafluoroborate] were synthesized according to a previously reported method as illustrated in FIG. 2 [Min, M., Bang, G. S., Lee, H. & Yu, B. C., A photoswitchable methylene-spaced fluorinated aryl azobenzene monolayer grafted on silicon, Chem. Commun. 46, 5232-5234, (2010)]. In a 50 mL round bottom flask, 4-alkyl (e.g., octyl, decyl, and dodecyl)-aniline (0.200 g) was dissolved in dry $CH_2Cl_2$ (10 mL) under $N_2$. This solution was added dropwise with a syringe to borontrifluoride etherate (2 equiv.) in a 100 mL round bottom flask cooled to −5° C. under $N_2$. Isoamyl nitrite (1.6 equiv.) was then added dropwise to the mixture with a syringe, and a solid was subsequently formed. The mixture was allowed to stir for 30 min at −5° C. before it was warmed to room temperature. The solid was then filtered and the filter cake was washed with cold $Et_2O$ to yield a white yellow solid after drying.

The characterization data collected for 4-octyl-benzenediazonium tetrafluoroborate [aryl diazonium salts containing 1-phenyloctane diazonium cations ($N_2^+$-PhC8)] are as follows: $^1$H NMR (300 MHz, (C=O(CD$_3$)$_2$): δ 8.62 (d, J=9.0 Hz, 2H), 7.88 (d, J=8.7 Hz, 2H), 2.89 (t, J=7.7 Hz, 2H), 1.68 (m, 2H), 1.30 (m, 10H), 0.91 (t, J=6.8 Hz, 3H); $^{13}$C NMR (300 MHz, (C=O(CD$_3$)$_2$): δ 158.5, 133.2, 131.6, 112.6, 36.2, 31.7, 29.4.

The characterization data collected for 4-decyl-benzenediazonium tetrafluoroborate [aryl diazonium salts containing 1-phenyldecane diazonium cations ($N_2^+$-PhC10)] are as follows: $^1$H NMR (300 MHz, (C=O(CD$_3$)$_2$): δ 7.18 (d, J=8.1 Hz, 2H), 7.01 (d, J=8.1 Hz, 2H), 1.59 (m, 2H), 1.29 (m, 16H), 0.90 (t, J=6.5 Hz, 3H); $^{13}$C NMR (300 MHz, (C=O(CD$_3$)$_2$): δ 162.0, 137.6, 129.6, 119.8, 34.9, 31.7, 29.5.

The characterization data collected for 4-dodecyl-benzenediazonium tetrafluoroborate [aryl diazonium salts containing 1-phenyldodecane diazonium cations ($N_2^+$-PhC10)] are as follows: $^1$H NMR (300 MHz, (C=O(CD$_3$)$_2$): δ 7.06 (d, J=8.1 Hz, 2H), 6.87 (d, J=8.4 Hz, 2H), 1.49 (m, 2H), 1.22 (m, 20H), 0.84 (t, J=5.7 Hz, 3H); $^{13}$C NMR (300 MHz, (C=O(CD$_3$)$_2$): δ 168.7, 137.4, 129.5, 119.3, 34.9, 31.8, 29.5.

<Preparation of Aryl Azobenzene Diazonium Salts>

Figure 3:
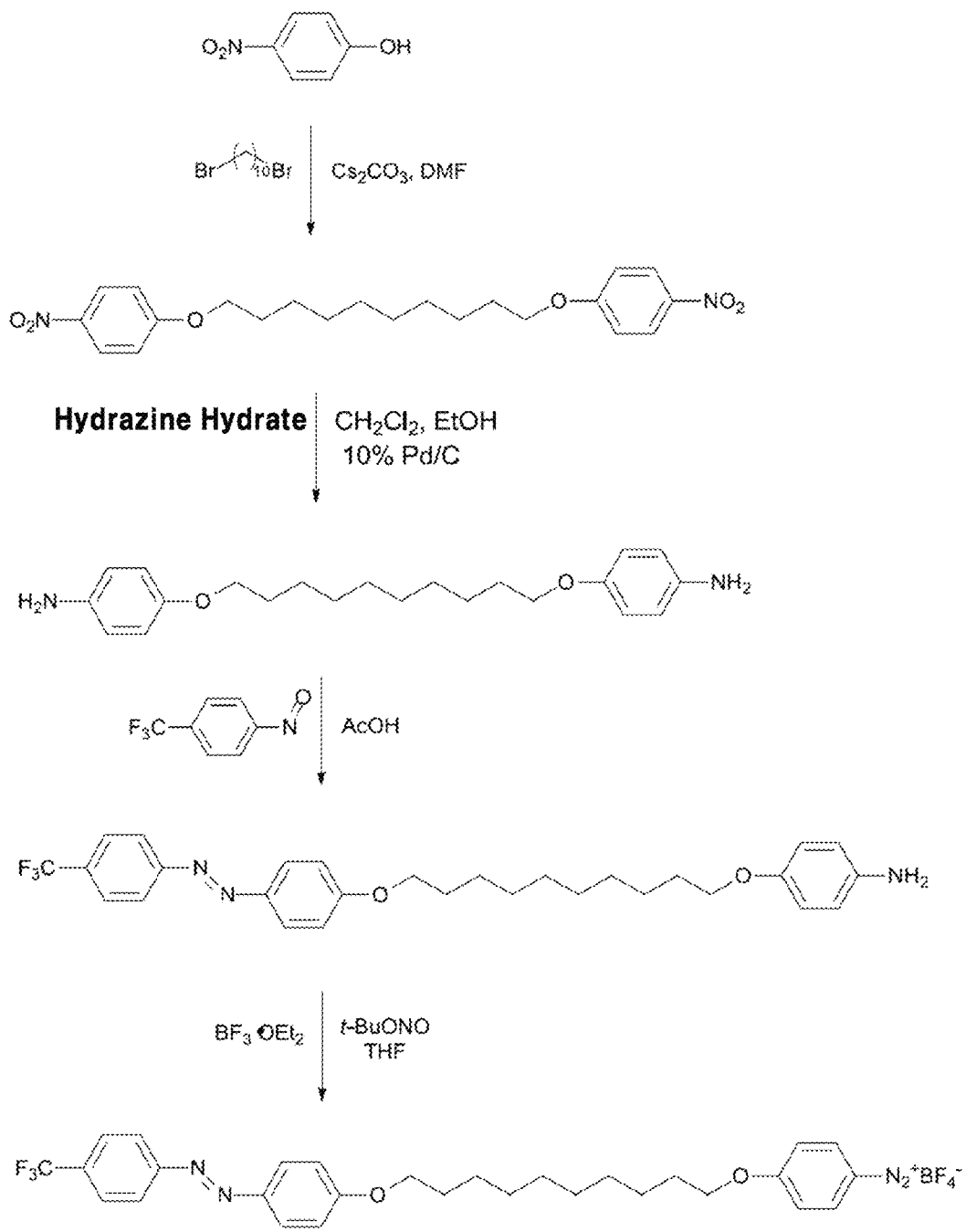
FIG. 3 is a series of chemical reactions used to synthesize (E)-4-(10-(4-((4-(trifluoromethyl)phenyl)diazenyl)phenoxy)decyloxy)benzenediazonium tetrafluoroborate according to an example of a method of preparing a device.

Aryl azobenzene diazonium salts: (E)-4-(10-(4-((4-(trifluoromethyl)phenyl)diazenyl)phenoxy)decyloxy)benzenediazonium tetrafluoroborate [aryl azobenzene diazoanium salts containing 1-phenyldecaneazobenzene diazonium cations ($N_2^+$-PhC10AB)] was also synthesized according to previously reported methods [Min, M., Bang, G. S., Lee, H. & Yu, B. C., A photoswitchable methylene-spaced fluorinated aryl azobenzene monolayer grafted on silicon, Chem. Commun. 46, 5232-5234, (2010)] as illustrated in FIG. 3 and characterized.

<Preparation of CVD Graphene Electrodes>

A Cu foil on which graphene was deposited by a single-layer chemical vapor deposition (CVD) was supplied by the Graphene Center of the SungKyunKwan University. The CVD graphene was transferred onto the substrates by a poly(methyl methacrylate) (PMMA)-mediated transferring method, as described (or modified) in a previous paper [Li, X. et al., Transfer of large-area graphene films for high-performance transparent conductive electrodes, Nano Lett. 9, 4359-4363, (2009)]. The CVD graphene electrodes were prepared by: (1) spin-coating PMMA (~50 mg mL$^{-1}$ in chlorobenzene) on a graphene/Cu foil, (2) drying the PMMA/graphene/Cu foil at 90° C. for 3 min (or under air blowing in a clean bench), (3) etching graphene on the backside of the Cu foil with $O_2$ plasma, (4) wet-etching the Cu foil through floating in an ammonium persulfate solution (20 g L$^{-1}$ in DI water), (5) transferring and washing a PMMA/graphene sheet (more than 2 times) using a SiO$_2$ substrate with DI water, (6) transferring the PMMA/graphene sheet onto appropriate substrates, (7) drying the PMMA/graphene/substrate under air in a clean bench, (8) removing PMMA with warm acetone (several times), (9) washing the graphene/substrate with isopropyl alcohol, and (10) drying the graphene/substrate under air in a clean bench, followed by drying under vacuum.

In the present Example, the CVD graphene was characterized by AFM (Agilent 5100 AFM/SPM system), TEM (JEOL JEM-2100F), FTIR (Bruker IFS-66/S), and Raman spectroscopy (Reinshaw, RM1000-In Via). The self-assembly of the aryl diazonium compounds was monitored by a nanogravimetry technique (EQCN, Shin) using a graphene-covered quartz crystal resonator (formed on the gold-coated quartz crystal from International Crystal Manufacturing Co., Inc.). Cyclic voltammetry (CHI, Electrochemical Analyzer 660A) of the graphene was performed under inert conditions in a three-electrode electrochemical cell that consists of a platinum wire (Pt-wire) counter electrode, an Ag/AgCl reference electrode, and a graphene-covered gold working electrode.

<Fabrication of Molecular Monolayer Devices>

Figure 4A:
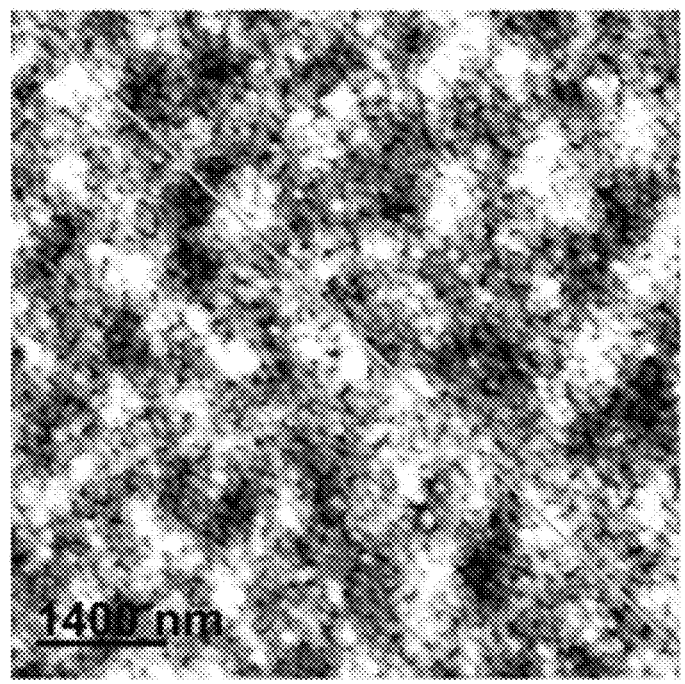
FIG. 4A is an atomic force microscopy (AMF) image (7×7 $\mu m^2$) showing surface roughness of an example of a PET substrate.
Figure 4B:
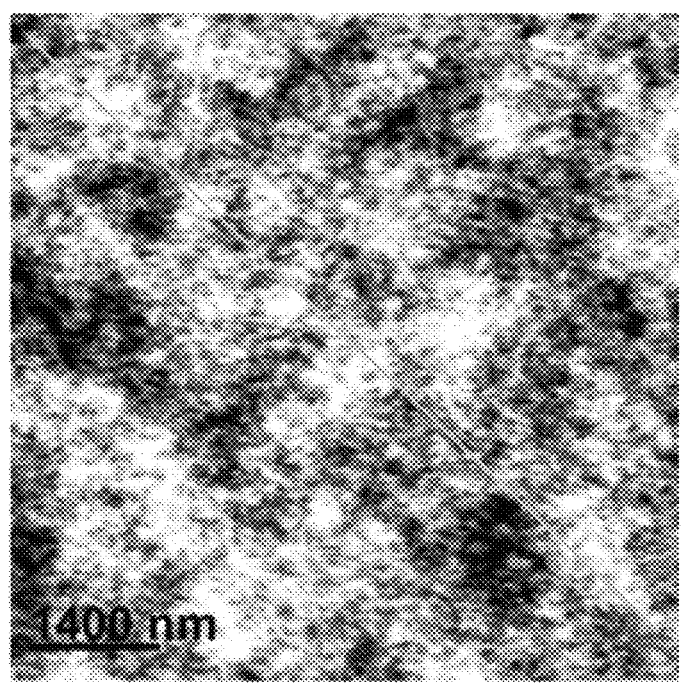
FIG. 4B is an atomic force microscopy (AMF) image (7×7 $\mu m^2$) showing surface roughness of an example of a PDMS/PET substrate.
Figure 4C:
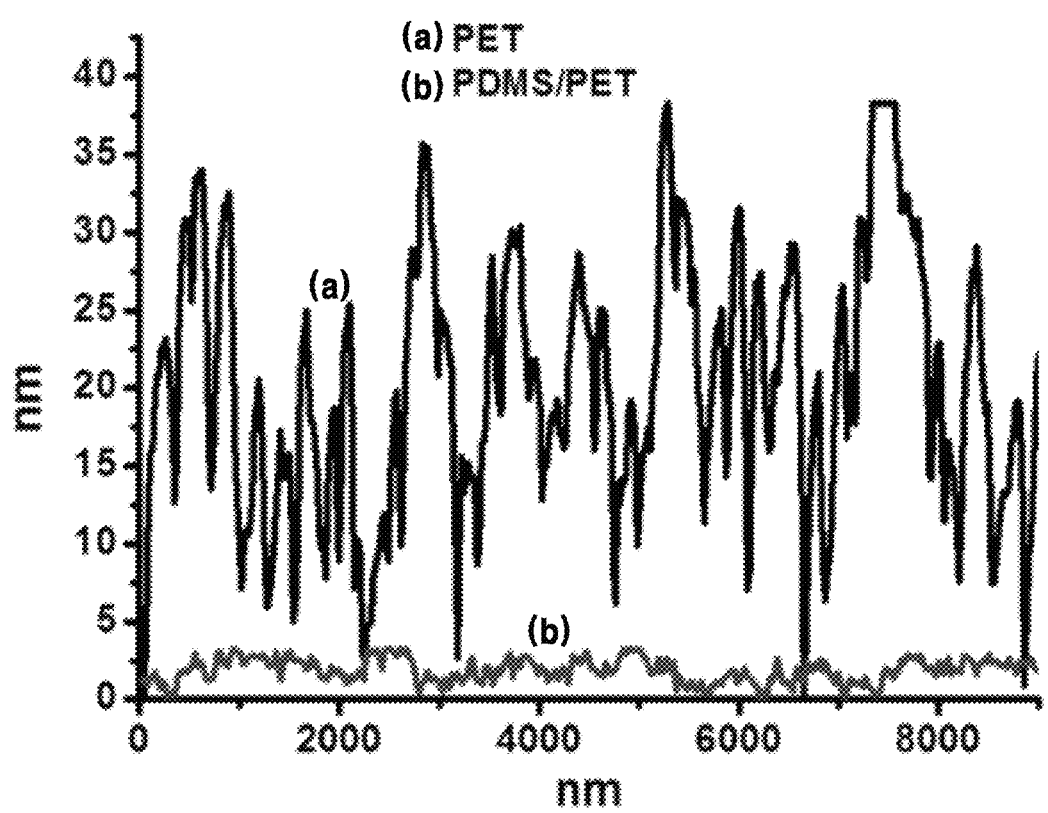
FIG. 4C is a graph showing line profile of a PET substrate and a PDMS/PET substrate according to the examples illustrated in FIGS. 4A and 4B.

A molecular monolayer-based vertical tunneling device including two graphene electrodes on a flexible plastic substrate was fabricated. A PET substrate was washed by using warm isopropyl alcohol, and $O_2$ plasma treatment was subsequently performed. Referring to FIG. 1, in (1), after a properly mixed PDMS [a silicon elastomer base/a silicon elastomer curing agent: 10/1 (volume/volume), Sylgard 184, Dow Corning] mixture was stood for 30 min, it was spin-coated on the PET substrate at 3,000 rpm and cured at 90° C. overnight. The substrate was then treated with $O_2$ plasma immediately before transferring the graphene to improve the surface wettability. The application of the PDMS much lowered the surface roughness, compared to the bare PET (FIGS. 4A and 4B), inducing the much higher device yield (80% to 90%) of the PDMS substrate than the device yield (40% to 50%) of the PET substrate. In (2), lower Au leads were e-beam evaporated (e.g., 50 nm Au/5 nm Ti at a rate of 0.1 Å$^{-1}$). In (3), a large-area single-layer graphene as a first electrode was carefully transferred onto the patterned PDMS/PET substrate containing the lower Au leads. In (4), the surface was etched with $O_2$ plasma to pattern the first graphene electrode. In (5), an aryl diazonium compound was self-assembled on the graphene/PDMS/PET substrate by using an immersion method under a dark inert condition. In this example, after transferring the first graphene electrode, 20 to 70 mM of aryl diazonium compounds were dissolved in DMF, and then, grafted onto the graphene-covered substrates by incubation in a glove box for 15 to 30 h. The aryl alkane or azobenzene monolayers on graphene were thoroughly washed with DMF, and then, dried overnight in vacuum. In (6), the second graphene electrode was transferred onto the aryl molecular monolayer/graphene/PDMS/

PET substrate. In (7), upper Au leads were e-beam evaporated (e.g., 50 nm Au at a rate of 0.1 Å$^{-1}$). In (8), the surface was etched with $O_2$ plasma to the pattern of the second graphene electrode. In (9), extra graphene other than the final active device area of 300×300 μm$^2$ (the rest of graphene on the outside of the active device area) and the organic molecules were removed by using $O_2$ plasma to obtain a molecular monolayer device.

<Characterization of the Molecular Monolayer Devices>

The electrical characteristics of the above-described devices were measured with a Keithley 4200-SCS semiconductor characterization system under the atmospheric condition. UV-Vis spectroscopy was performed using a Shimadzu UV-3600 UV-Vis-NIR. A photo-irradiation with 360 nm/430 nm light was performed using a Power Arc UV 100 device (UV Process Supply Inc.).

Structural characterization was conducted by using a vertical molecular tunneling device on a $SiO_2$/Si substrate, which was prepared in the same manner as that for the vertical molecular tunneling device on the flexible plastic device (PDMS/PET), through taking microscopy images and measuring Raman spectra.

Figure 5A:
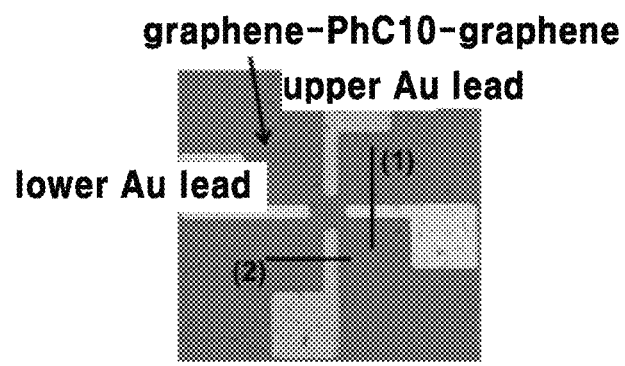
FIG. 5A is an optical microscope image of an example of a graphene-PhC10 monolayer-graphene device on $SiO_2$/Si.
Figure 5B:
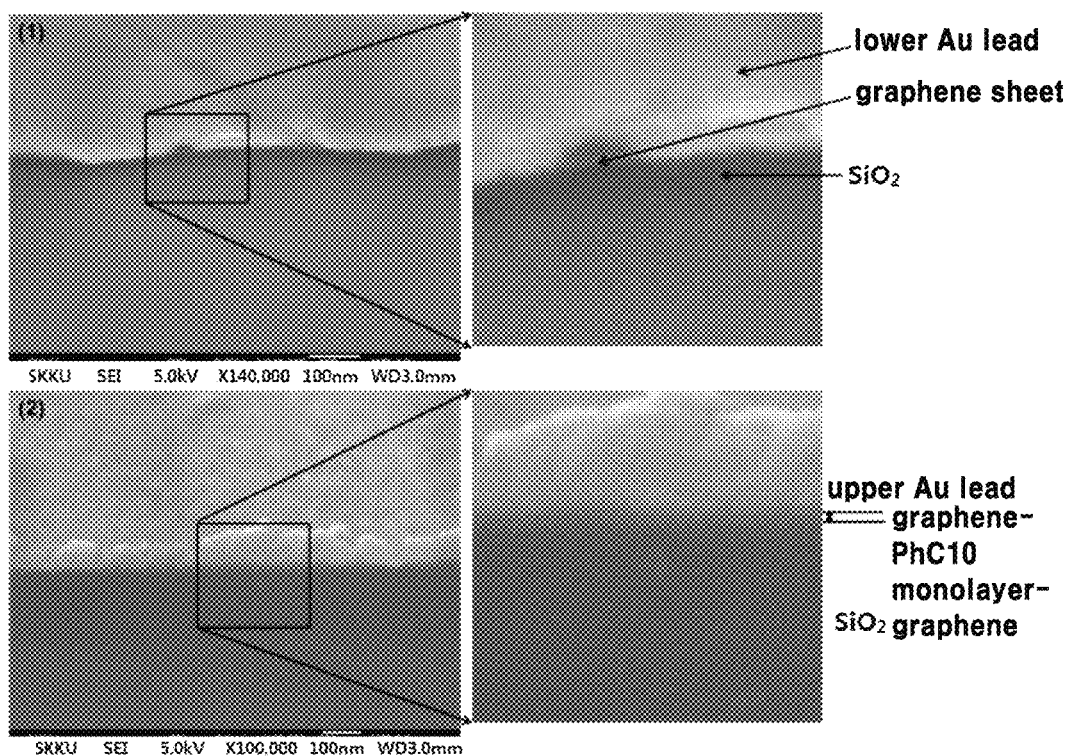
FIG. 5B includes a field emission scanning electron microscopy (FE-SEM) image (1) of a cross section of an example of a vertical graphene-PhC10 monolayer-graphene device (Ph means phenyl) of $SiO_2$/Si along line (1) of FIG. 5A, and a field emission scanning electron microscopy (FE-SEM) image (2) of a cross section of an example of a vertical graphene-PhC10 monolayer-graphene device (Ph means phenyl) of $SiO_2$/Si along line (2) of FIG. 5A.

FIG. 5B includes cross-sectional images of the molecular monolayer device according to the example embodiment along lines (1) and (2) of FIG. 5A. The images were taken by FE-SEM (JEOL JSM75WF) along the cross sections that cut through an upper Au lead and a lower Au lead of the device, and illustrate properly formed graphene-molecular monolayer-graphene junctions.

Figure 6:
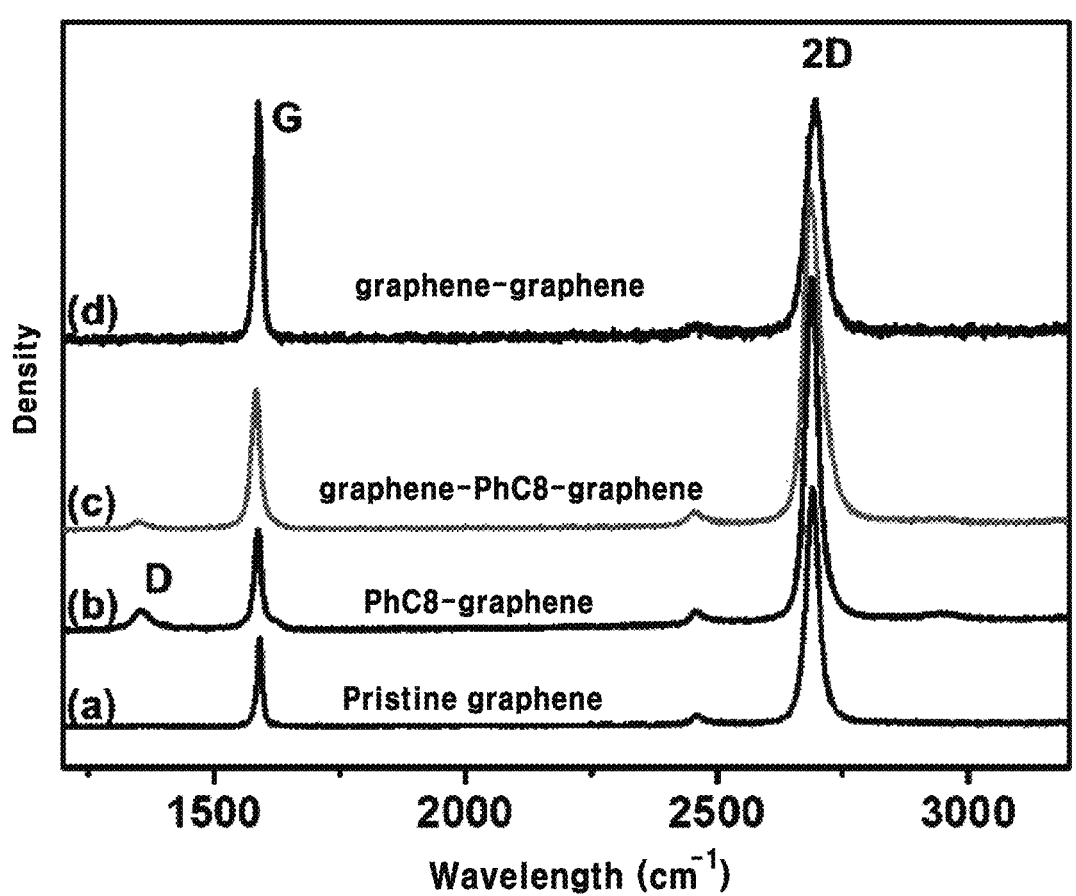
FIG. 6 illustrates Raman spectra of graphene in different junctions obtained from three major steps in an example of a method of preparing a graphene-molecular monolayer-graphene junction.

FIG. 6 illustrates Raman spectra of graphene in different junctions, which were obtained at the three major steps for preparing graphene-molecular monolayer-graphene junctions in accordance with an example embodiment. Spectral line (a) corresponds to the formation a first graphene electrode (bare graphene). Spectral line (b) corresponds to the formation of a PhC8 monolayer on the first graphene electrode. Spectral line (c) corresponds to the formation of a second graphene electrode on the PhC8 monolayer-graphene. Spectral line (d) corresponds to a Raman spectra (i.e., a graphene-graphene layer) obtained from the second graphene electrode on the first graphene electrode. The Raman spectra illustrated in FIG. 6 were obtained at excitation energy (514 nm) of 2.41 eV. Referring to spectral line (a) of FIG. 6, the Raman fingerprint of the monolayer graphene is very sharp [30~33 cm$^{-1}$/full-width at half maximum (FWHM)], and a symmetric 2D band at the periphery of 2,690 cm$^{-1}$ was clearly observed. Referring to spectral line (b), the D band at the periphery of 1,350 cm$^{-1}$ appeared after PhC8 grafting on the graphene bottom electrode, which indicates that defects resulted from formation of C—C sp$^3$ bonding. The G band of the bare graphene at the periphery of 1,590 cm$^{-1}$ shifted into the periphery of 1,587 cm$^{-1}$ for PhC8-graphene, which indicates that aryl molecules induce electron-doping on the bare graphene. Referring to spectral line (c), the deposition of the second graphene electrode induced expansion of the 2D band (approximately 37 cm$^{-1}$). The G band of the graphene-PhC8-graphene shifted into the opposite side at the periphery of 1,580 cm$^{-1}$, and a peak ratio of the 2D/G was reduced from 3 to 3.5 (for the bare graphene and the PhC8-graphene) to 2.3 (for the graphene-PhC8-graphene). Referring to spectral line (d), the Raman spectra of bilayer graphene (i.e., graphene-graphene) illustrates that the peak ratio of the 2D/G was approximately 1.0, and FWHM of the 2D peak was approximately 43 cm$^{-1}$. It is highly likely that compared to the defect D peak in spectral line (a) of FIG. 6 and spectral line (d) of FIG. 6, the defect D peak in spectral line (b) of FIG. 6 (PhC8-graphene) will result from formation of carbon-carbon sp$^3$ chemical bonding, and that compared to the reduced D peak in spectral line (b) of FIG. 6, the reduced D peak in spectral line (c) of FIG. 6 will be an effect of an additional second graphene layer on PhC8-graphene having defectless physical contact. Accordingly, the Raman spectra can clearly explain the origin of the defect D peak from different carbon-carbon sp$^3$ chemical bondings of small pinholes or boundary vacancy defects of a molecular monolayer as most molecular monolayers have. In addition, the pinholes and the defects of the molecular monolayer are not large enough to form electronic shorting, and it is believed that the indefective second graphene electrode [spectral line (d) of FIG. 6], which reduces defects on the PhC8-graphene as shown in spectral line (c) of FIG. 6, can effectively form molecular junctions on the first graphene electrode without shorting. However, the pinholes and the defects will induce the bilayer effect of the Raman spectra of the graphene-PhC8-graphene, even though there is the PhC8 molecular monolayer between the two graphene sheets as shown in spectral line (c) of FIG. 6. Statistical analysis for the G-band and the 2D-band of the Raman spectra of each sample in each of the corresponding steps for the device preparation was summarized in Table 1. Table 1 shows statistical data for the G-band and the 2D-band of the Raman spectra obtained from 10 different positions for three devices of each sample (the error bars denote the standard deviations).

TABLE 1

| | graphene (graphene-graphene) | PhC8-graphene (graphene-PhC8-graphene) | PhC10-graphene (graphene-PhC10-graphene) | PhC12-graphene (graphene-PhC12-graphene) |
|---|---|---|---|---|
| raito of 2D/G | 2.8 ± 0.4 (1.0 ± 0.2) | 2.4 ± 0.5 (1.9 ± 0.5) | 2.3 ± 0.3 (2.1 ± 0.3) | 2.7 ± 0.5 (2.3 ± 0.5) |
| FWHM (cm$^{-1}$) | 31 ± 3 (45 ± 3) | 32 ± 2 (35 ± 3) | 33 ± 2 (35 ± 2) | 33 ± 3 (32 ± 2) |

<Results and Study>

Figure 7A:
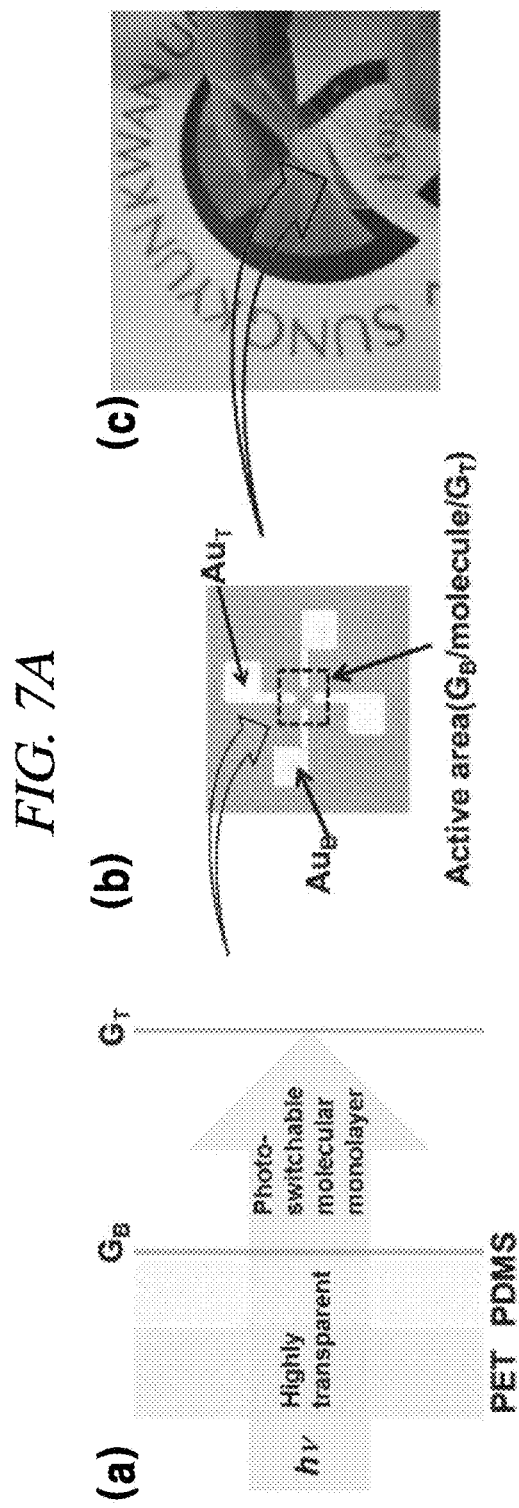
FIG. 7A includes a schematic diagram illustrating the structure of a vertical junction (a) according to one example, an optical image of one example device (b), and an array of 100 devices on a plastic sheet and imposed over an image to illustrate transparency (c).
Figure 7B:
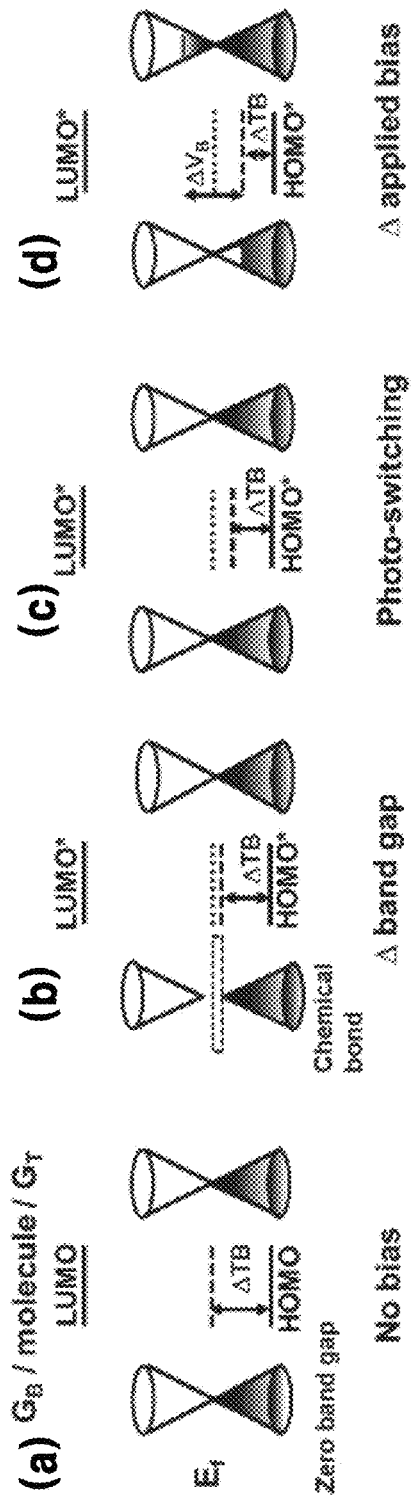
FIG. 7B includes diagrams (a)-(d) that illustrate tunneling barrier (ΔTB) of an example of a molecular monolayer device. Diagram (a) illustrates the tunneling barrier (ΔTB) corresponding to a molecular barrier at a zero bias for an example of a molecular monolayer device including a graphene-molecule-graphene structure. Diagram (b) illustrates the tunneling barrier (ΔTB) corresponding to a change in the graphene work function with diazonium reactions. Diagram (c) illustrates the tunneling barrier (ΔTB) corresponding to a change in a molecular barrier with photo-switching. Diagram (d) illustrates the tunneling barrier (ΔTB) corresponding to an applied bias ($\Delta V_B/G_B$–$G_T$) for an example of a molecular monolayer device including a graphene-molecule-graphene structure.

According to the present Example, for two-terminal transparent and flexible graphene-based vertical molecular devices, aryl molecular monolayer tunnel junctions between two graphene electrodes were constructed as illustrated in FIG. 7A. For transparent and flexible graphene-molecular monolayer-graphene junctions, aryl alkanes, as a passive molecular resistor, and aryl azobenzene, as a photo- and electro-active molecular switch, were carefully designed, and plastic substrates [e.g., polydimethylsiloxane (PDMS), and polyethylene terephthalate (PET)] were applied. For device preparation, a large-area single-layer graphene sheet grown on Cu foils through a chemical vapor deposition (CVD) process was carefully transferred onto the plastic substrates using a poly(methyl methacrylate) (PMMA)-mediated transferring method. A layer of PDMS spin-coated on the PET substrate was introduced to reduce the surface roughness of the substrate in order to increase the device yield to over 80%. Using the reactions illustrated in FIGS. 2 and 3, aryl diazonium compounds were self-assembled onto the first graphene electrode/substrate combination. The second graphene electrode was then transferred onto the aryl molecular monolayer/graphene/substrate combination in the same manner as the first graphene electrode, in a manner consistent with FIG. 1, FIG. 5B, FIG. 6 and FIG. 7A. Through electrophilic diazonium reactions, the band structures of the graphene electrodes were modulated such that a covalent C—C $sp^3$ bond forms between the aryl radicals and C═C $sp^2$ carbon atoms. Electronic coupling between the graphene and molecules through a covalent bond may reduce the contact resistance, thereby facilitating true molecular effects in monolayer-based devices. Referring FIG. 7B, the energy positions of molecular tunneling barriers between graphene electrodes with no applied bias are depicted based on band diagrams of the two graphene sheets parallel located using a well-known band structure of graphene that has no band gap. According to diagram (b) of FIG. 7B, the formation of covalent C—C $sp^3$ bonds may induce the band gap opening of the graphene electrode (a phenomenon of generation or spreading of a band gap) and reduce molecular tunneling barriers. According to diagram (c), molecular photo-switching induces a decrease (or increase) in the barrier height. In addition, according to diagram (d), the molecular tunneling barriers are modified with a voltage applied to the two-terminal electronic devices, which characterizes molecular functionalities.

Figure 8A:
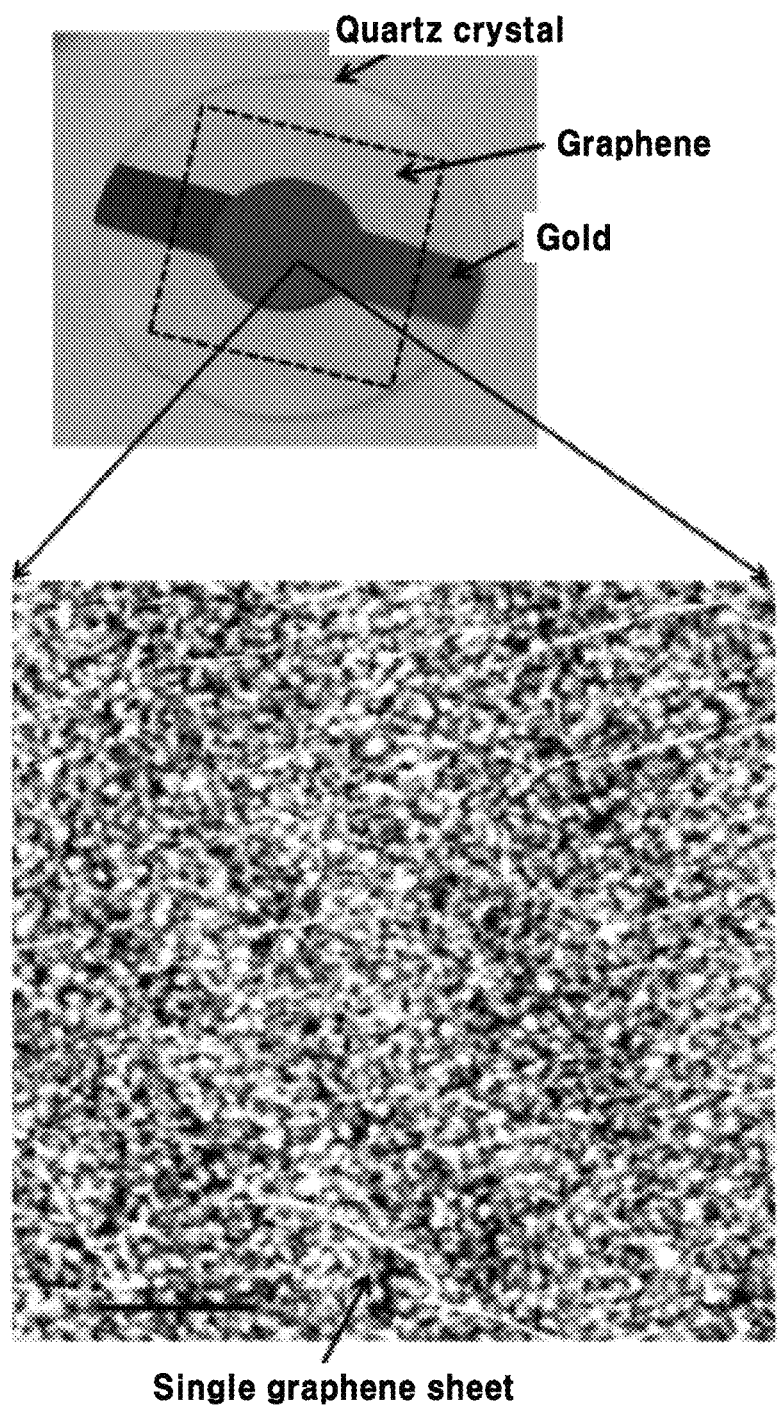
FIG. 8A includes a photographic image and an AFM image (the scale bar: 700 nm) of graphene completely covering a quartz crystal resonator (graphene/gold/quartz crystal) according to one example.
Figure 8B:
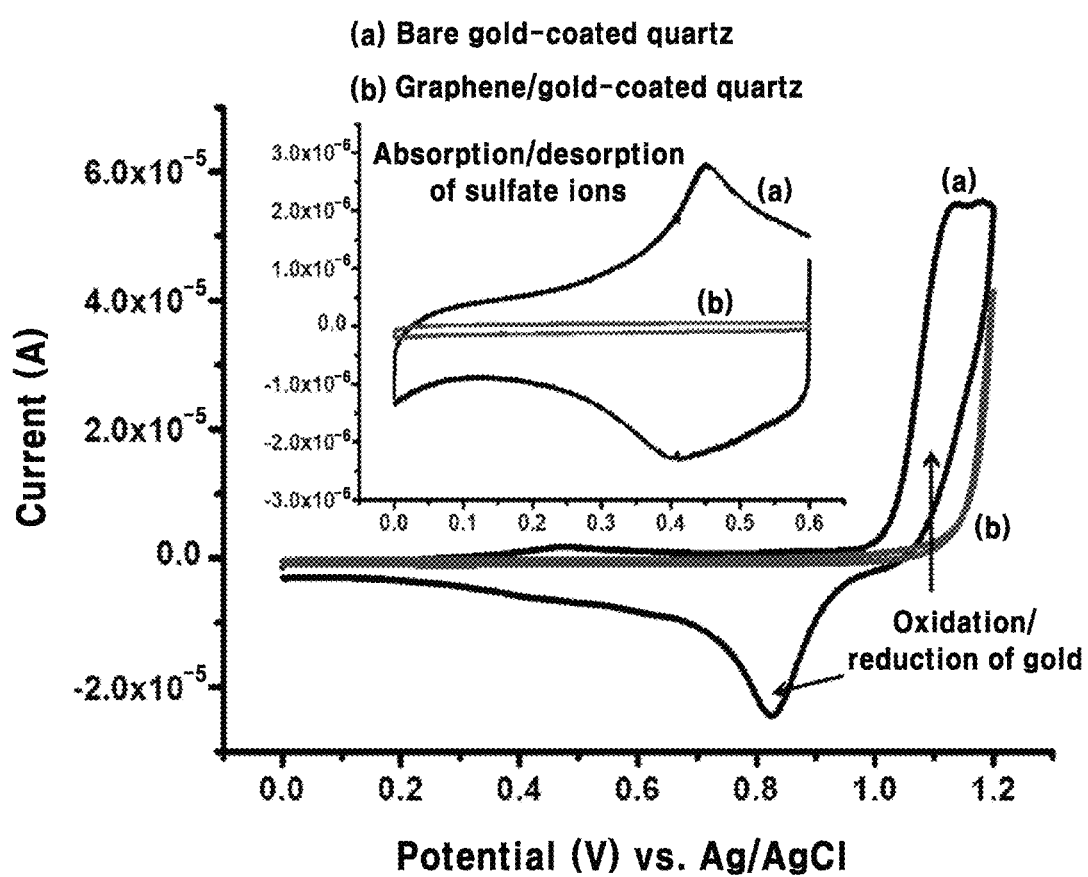
FIG. 8B includes a graph illustrating cyclic voltammograms (CVs) of bare gold-coated quartz (black line) and graphene/gold-coated quartz (dotted line) in 0.05 M $H_2SO_4$ at a scanning rate of 50 $mVs^{-1}$ according to one example embodiment.
Figure 8C:
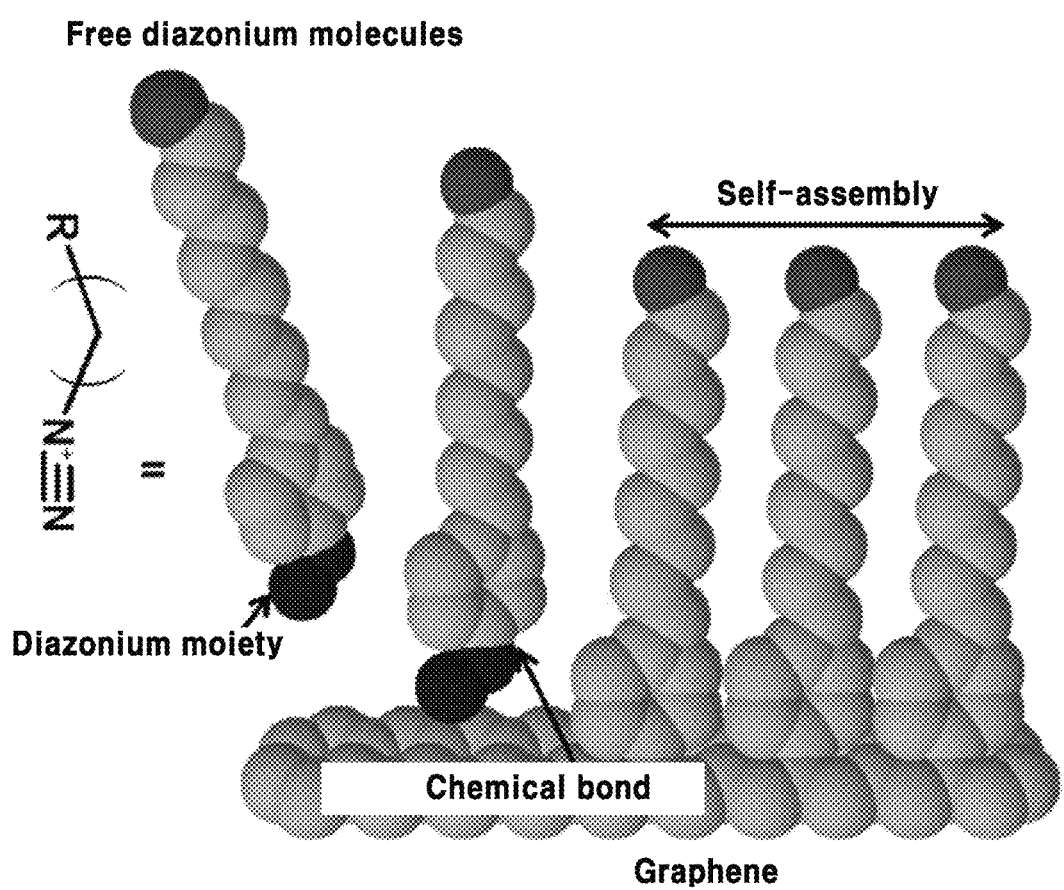
FIG. 8C is a schematic diagram illustrating a process of molecular monolayer formation on graphene according to an example of a method of forming the monolayer.
Figure 8D:
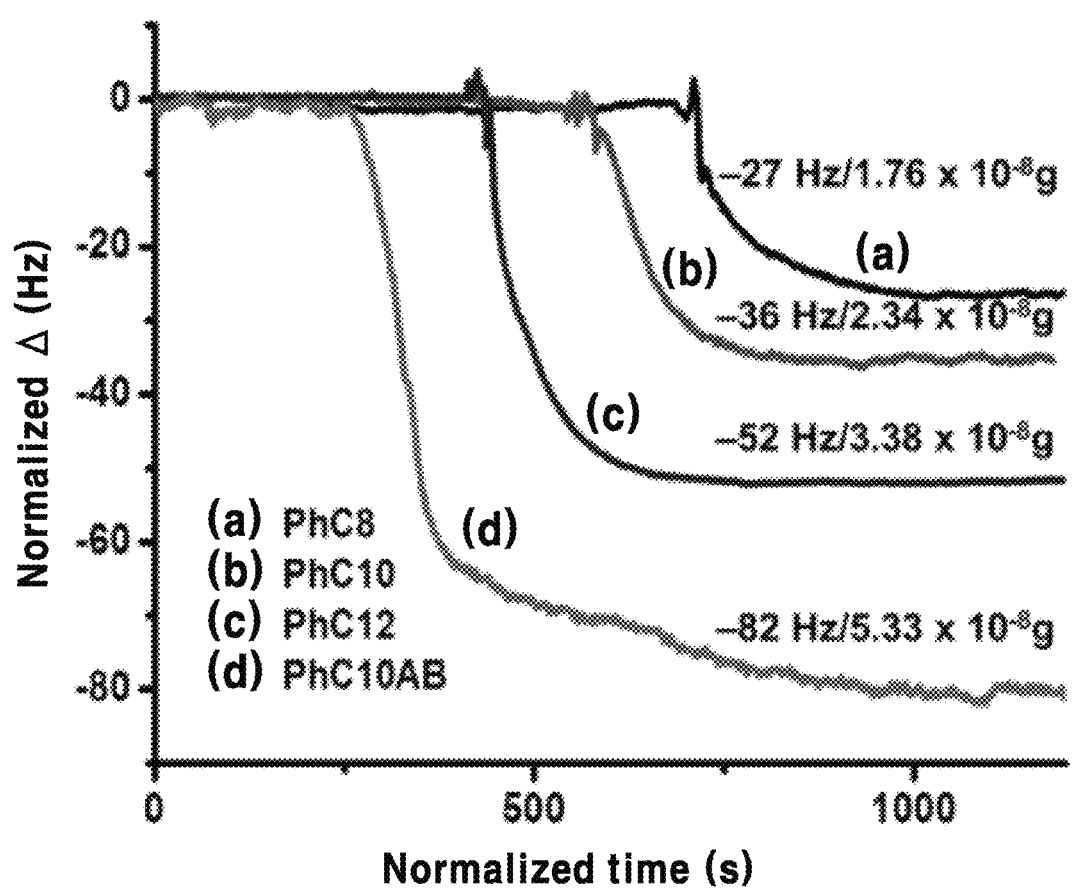
FIG. 8D is a graph illustrating in-situ frequency changes due to the self-assembly of organic molecules containing aryl diazonium cations, as shown in the characterization of the grafting of organic molecules containing aryl diazonium cations on graphene in accordance with an example embodiment.
Figure 11A:
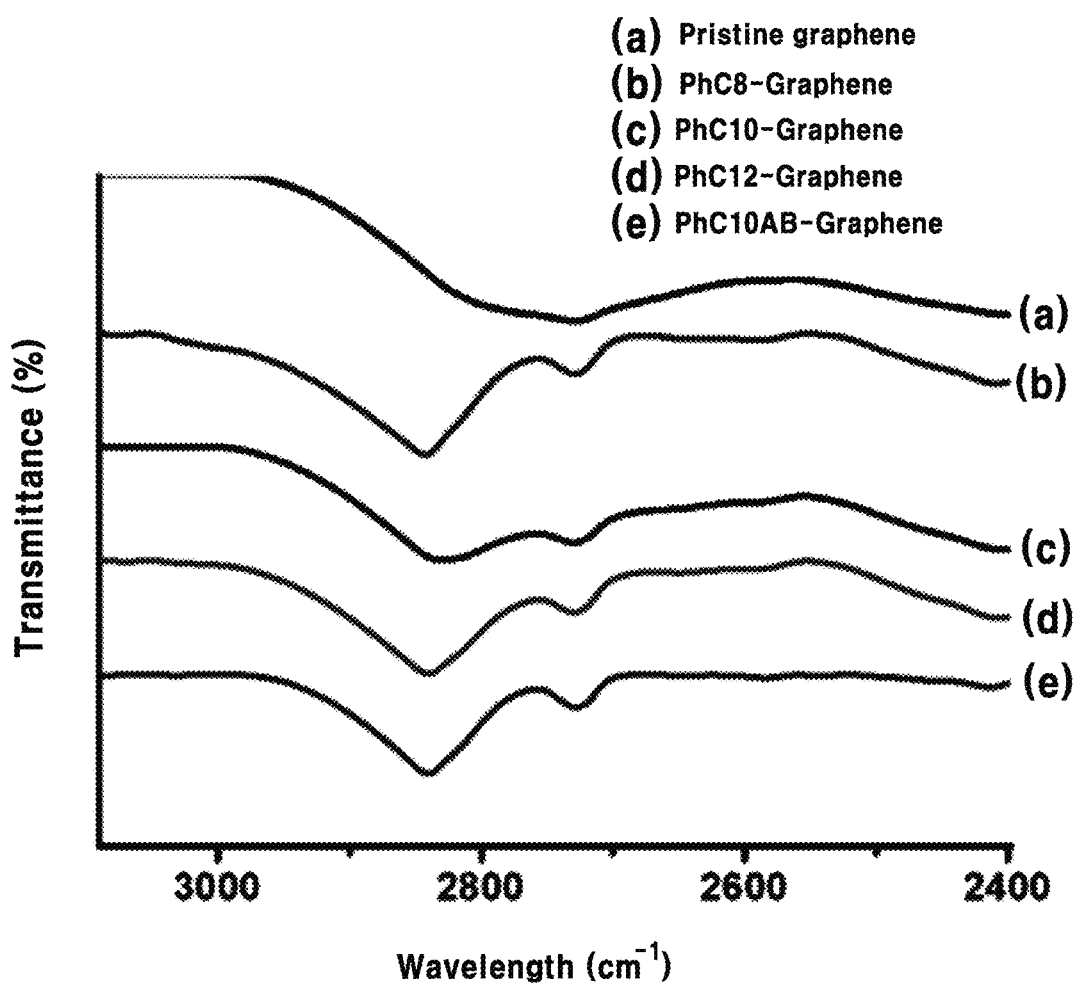
FIG. 11A is a Fourier Transform Infrared (FRIR) spectra of aryl alkane monolayer-modified graphene on ITO in accordance with an example embodiment.
Figure 11B:
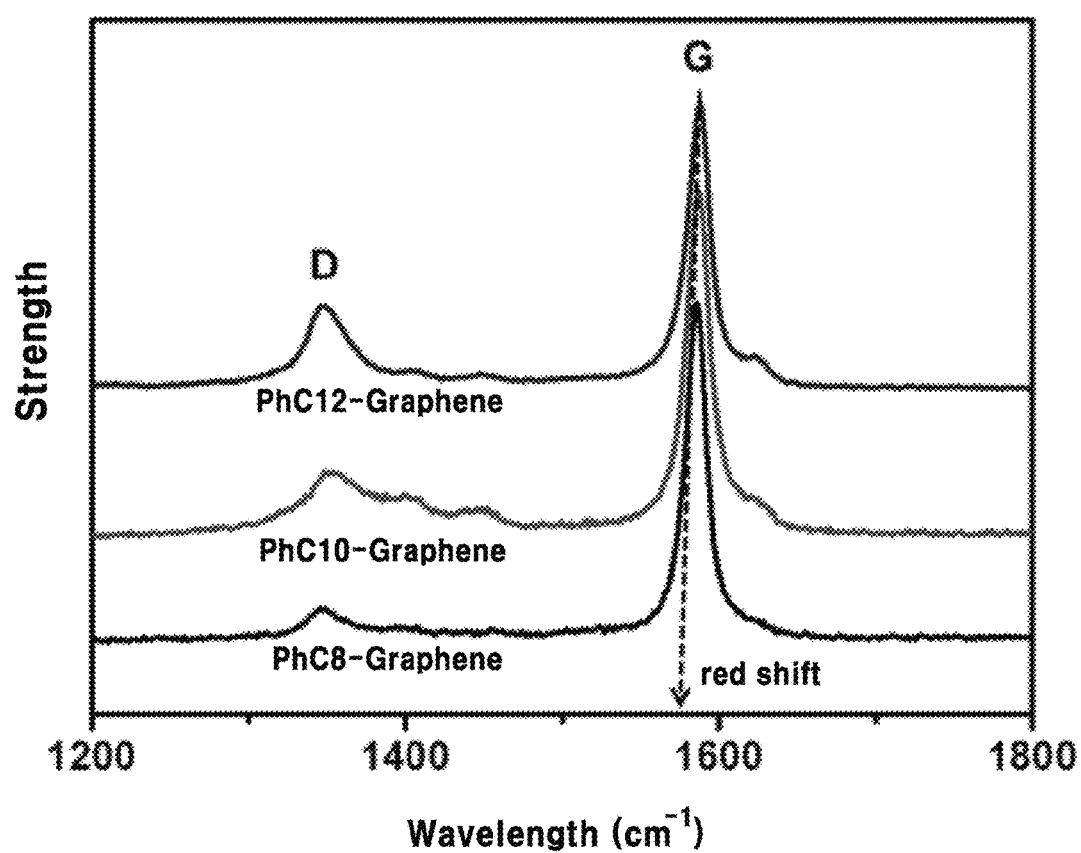
FIG. 11B is a Raman spectra of aryl alkane monolayer-modified graphene on $SiO_2$ in accordance with an example embodiment.

A certain amount of self-assembled aryl diazonium compounds on the graphene electrode [for instance, organic molecules containing a 1-phenyloctane diazonium cation ($N_2^+$-PhC8), a 1-phenyldecane diazonium cation ($N_2^+$-PhC10), a 1-phenyldodecane diazonium cation ($N_2^+$-PhC12), and an 1-phenyldecan azobenzene diazonium cation ($N_2^+$-PhC10AB), which resulted in monolayers of PhC8, PhC10, PhC12, and PhC10AB, respectively] was quantitatively measured by a nanogravimetry technique using a graphene-covered quartz crystal resonator. Referring to FIG. 8A, the graphene-covered electrode was pretested by atomic force microscopy (AFM) and cyclic voltammetry. Referring to FIG. 8B, the cyclic voltammograms (CVs) revealed that graphene perfectly blocked the absorption/desorption of sulfate ions on gold and the oxidation/reduction of gold, which can limit the absorption of organic molecules containing aryl diazonium cations on the backbone framework of graphene. FIG. 8C illustrates the self-assembly process of the organic molecules containing aryl diazonium cations on the graphene electrode. In-situ frequency changes show a dependency on the molecular mass, as illustrated in FIG. 8D. An average of $6.8\pm1.4\times10^{13}$ grafted molecules (on a surface area of 0.28 cm$^2$) was obtained, which indicates that one in nine carbon atoms in the C═C $sp^2$ framework was occupied by an aryl molecule. The characteristics of the aryl alkane monolayer on graphene were clearly identified, as illustrated in FIG. 9 to FIG. 11B. AFM photographical images and line profiles of FIG. 9 confirmed the molecular length of the aryl monolayer on the graphene. A transmission electron microscopy (TEM) image of FIG. 10 revealed an expanded lattice constant due to the formation of $sp^3$ C—C bonds. In FIGS. 11A and 11B, the Fourier transform infrared (FTIR) absorption peak of the $sp^3$ C—H stretching of the alkyl chain was identified, and a Raman shift in the structural defects band appeared due to the generation of $sp^3$ carbon bonds.

Characterization of the grafting of the organic molecules containing aryl diazonium cations on the graphene is set forth. First, in in-situ nanogravimetry using a graphene-covered quartz crystal resonator, total changes of the frequency ($\Delta f$) can be converted into changes of total mass ($\Delta m$) by using the Sauerbrey equation presented as $\Delta m = c\, \Delta f$, and $c = 2\, n\, f_0^2 A^{-1}(\rho_q \mu_q)^{-1/2}$, in which the harmonic number (n) is 1, the resonance frequency ($f_0$) is 9 MHz, the active crystal area (A) is 0.28 cm$^2$, density ($\rho_q$) of quartz is 2.648 gcm$^{-3}$, and the shear modulus of quartz on AT-cut crystal ($\mu_q$) is $2.947\times10^{11}$ g cm$^{-3}$, so that $\Delta m = 0.65\times10^{-9}$ g Hz$^{-1}$. Eventually, the number of the aryl molecules on graphene was $0.92\times10^{-10}$ mol/$5.55\times10^{13}$ molecules (PhC8), $1.07\times10^{-10}$ mol/$6.45\times10^{13}$ molecules (PhC10), $1.37\times10^{-10}$ mol/$8.26\times10^{13}$ molecules (PhC12), and $1.07\times10^{-10}$ mol/$6.44\times10^{13}$ molecules (PhC10AB). An average of the number of the aryl alkane molecules was calculated to be approximately $6.8\pm1.4\times10^{13}$, while the distance between neighboring carbon atoms within a unit cell ($a_{gr}$) of graphene was calculated to be approximately $0.25\times10^{-9}$ m$^2$. The occupied area of the carbon atoms within the unit cell is $4.6\times10^{-20}$ m$^2$. Accordingly, the number of carbon atoms of the active electrode is approximately $6.1\times10^{14}$ m$^2$ (within 0.28 cm$^2$). Surface coverage of aryl molecules to the carbon atoms of the graphene is approximately 0.11, which means that one of nine carbon atoms is occupied by an aryl molecule. The surface coverage of the aryl molecules is similar to the surface coverage within a 2×2 unit cell (8 carbon atoms consist of one aryl molecule).

Figure 9:
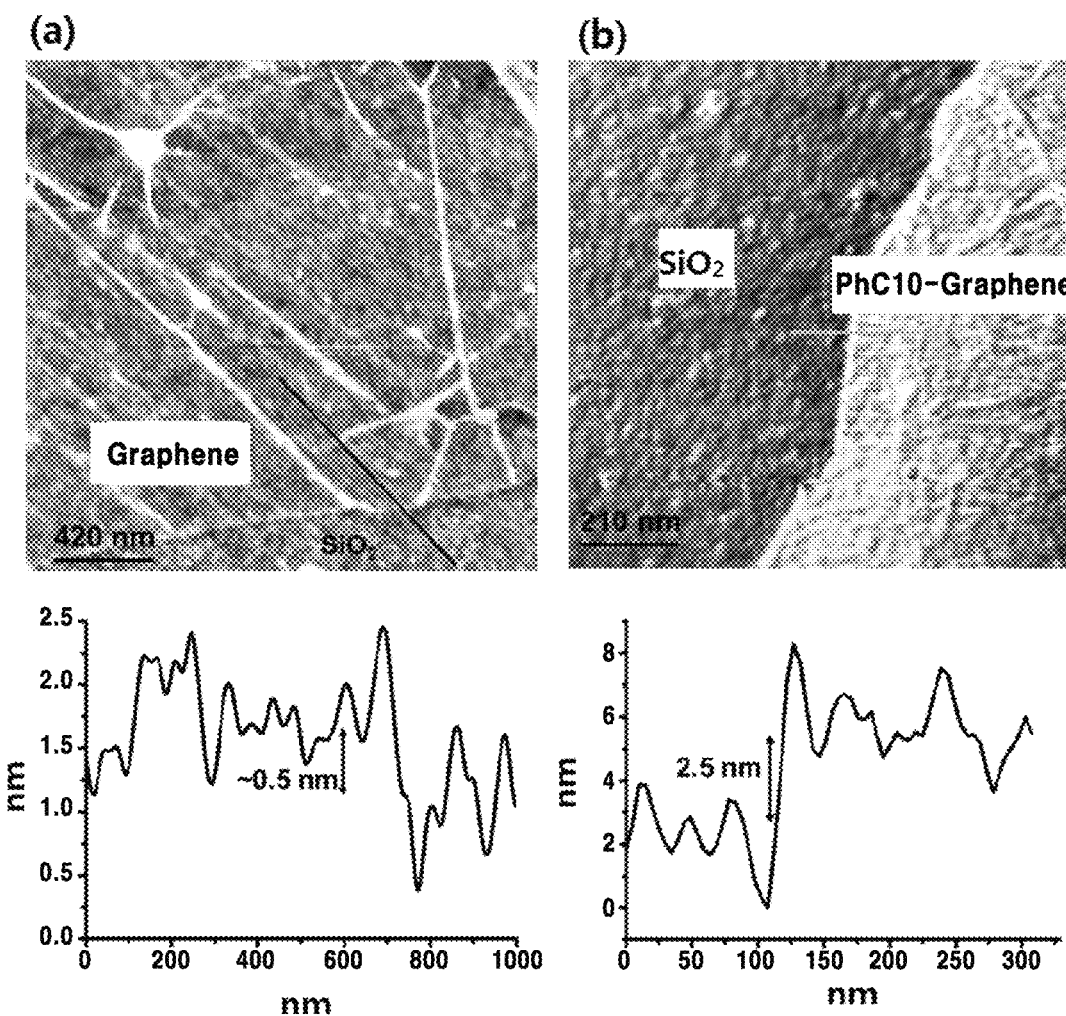
FIG. 9 includes an AFM image (a) of bare graphene and an AFM image (b) of a PhC10 monolayer-graphene on $SiO_2$, and line profiles corresponding thereto, with respect to a molecular effect on an AFM image of graphene in accordance with an example embodiment.
Figure 10:
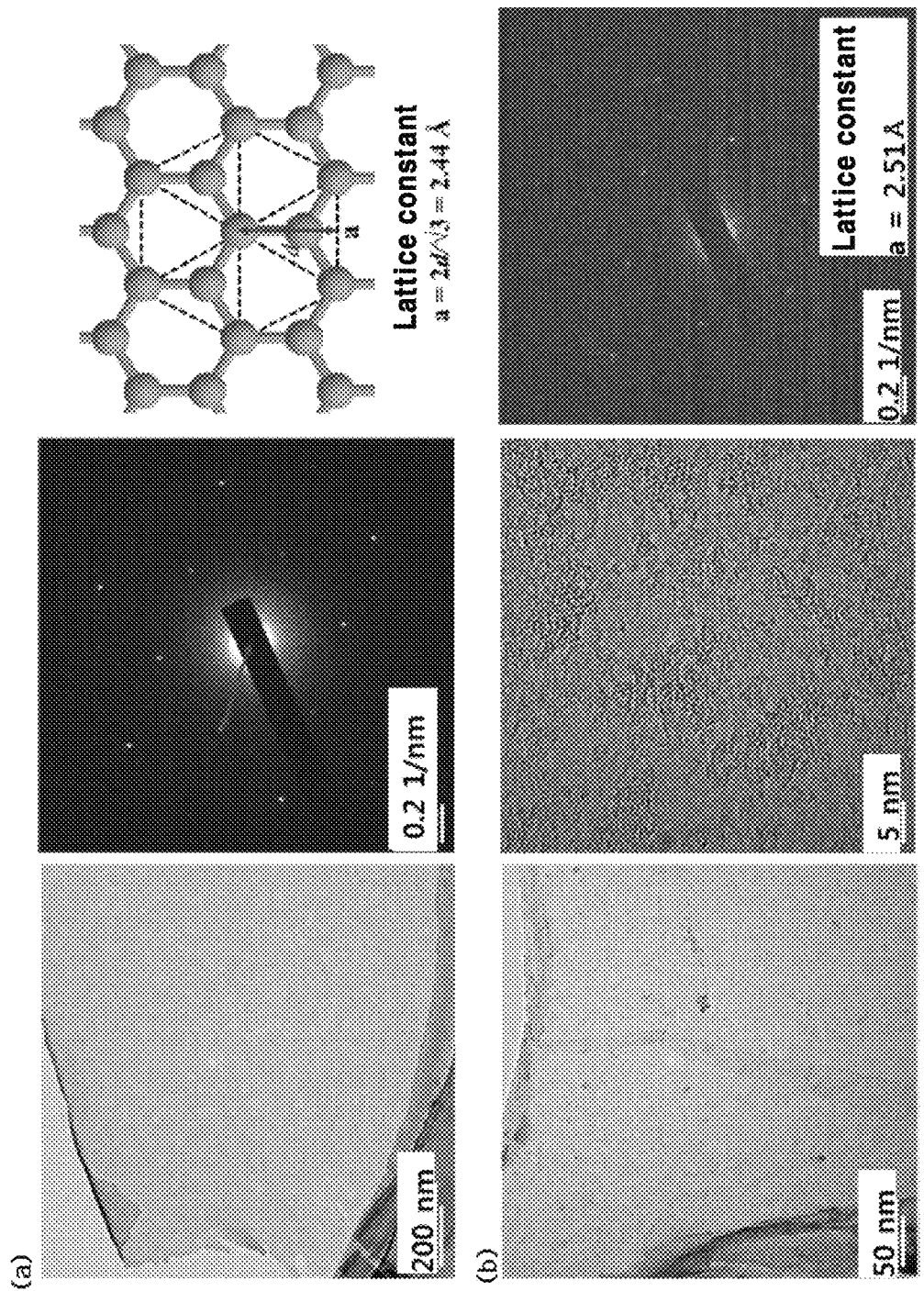
FIG. 10 includes (a) a TEM image of pristine graphene (left), a selected area electron diffraction (SAED) pattern thereof (middle), and a crystalline structure of graphene (right), and (b) TEM images (left and middle) of PhC8-modified graphene and a SAED pattern thereof (right), with respect to a molecular effect on a TEM image of graphene in accordance with an example embodiment.

With respect to the aryl monolayer effect on microscopy images of graphene, as demonstrated from the AFM images of FIG. 9, the height of the PhC10-graphene was measured approximately 2.5 nm from the SiO$_2$ surface, which means formation of a PhC10 monolayer (an approximately 2 nm thickness corresponding to a molecular length) on the graphene (an approximately 0.5 thickness). In the high-resolution TEM image, the lattice constant of the PhC8-graphene slightly increased (a=2.51 Å) after the PhC8 modification, compared to the lattice constant (a=2.44 Å) of the bare graphene, which means the expanded effect generated due to release of C═C $sp^2$ bonds for formation of covalent C—C $sp^3$ bonds. Chemically functionalized graphene containing an aryl group induced fine change in the lattice constant, compared to the bare graphene, without completely transforming the hexagonal pattern of the bare graphene. The fine increase (e.g., 2.51 Å) of the lattice constant, which is acceptable in the chemically functionalized graphene containing an aryl group, is probably due to the high coverage rate of the aryl group on the graphene, which can induce the entire effect of the lattice compression of the functionalized graphene (e.g., to which hydrogen was added through $sp^3$ C—C bonds).

Meanwhile, with respect to the aryl monolayer effect on the FTIR and the Raman spectra of graphene, the absorption peak of 2,850 cm$^{-1}$ [$sp^3$ C—H stretch of an alkyl chain] appeared in the FTIR spectra of FIG. 11A after grafting of aryl alkane on the graphene. In the Raman spectra of FIG. 11B obtained for the aryl alkane monolayer-graphene, the G band red-shifted from the 1,590 cm$^{-1}$ position of the bare graphene. Short aryl molecules red-shifted more, compared to long aryl molecules, which means that short aryl molecules can induce more effective doping than long aryl molecules.

Figure 12A:
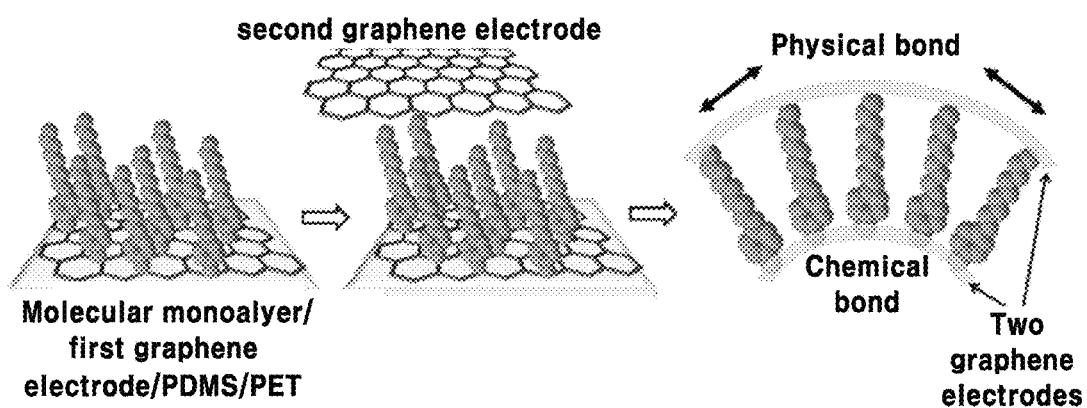
FIG. 12A is a schematic diagram illustrating a transparent and flexible molecular monolayer junction between two graphene electrodes according to an example embodiment.
Figure 12B:
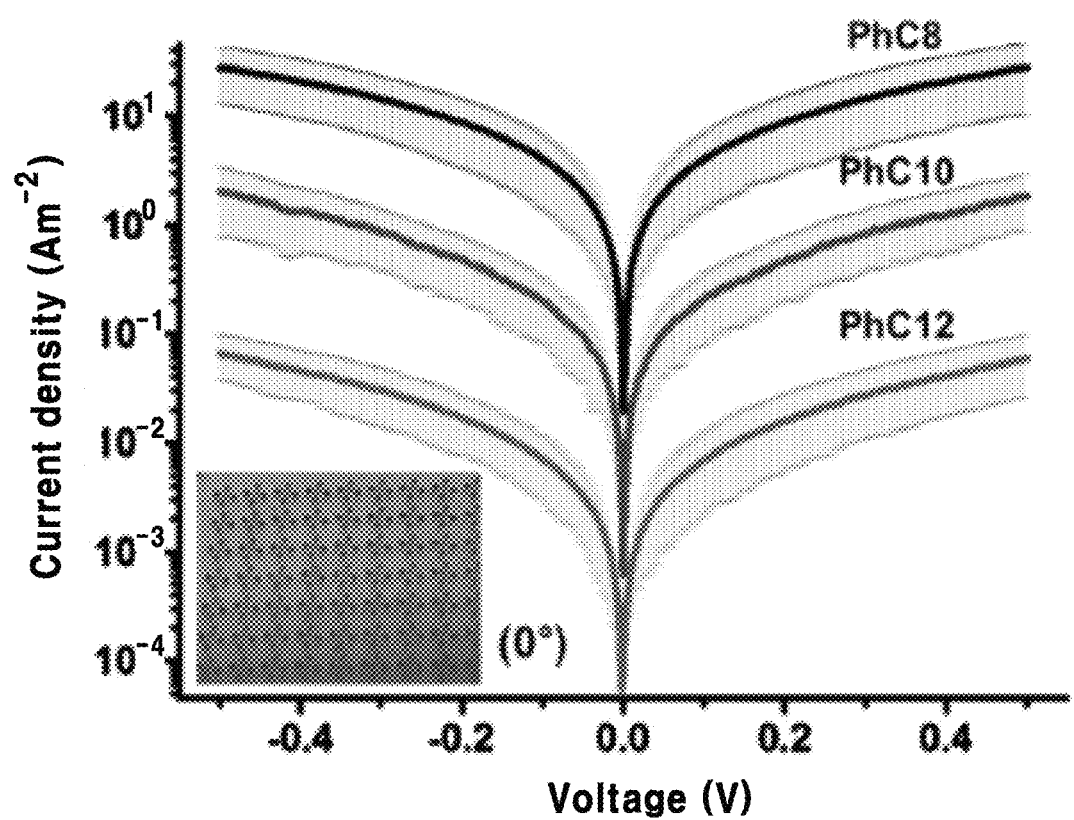
FIG. 12B is a graph illustrating current density-voltage plots for each aryl alkane monolayer according to an example embodiment.
Figure 12C:
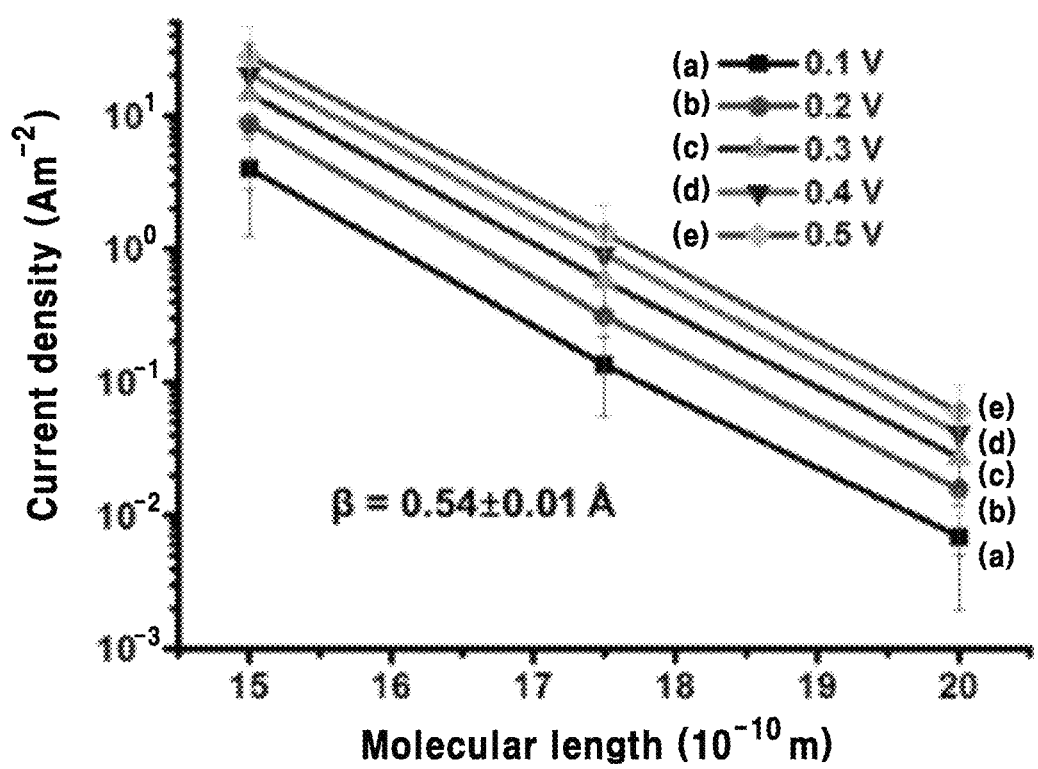
FIG. 12C is a graph illustrating current density plots at different voltages versus the molecule length in an aryl alkane self-assembled monolayers (SAMs) according to an example embodiment.
Figure 12D:
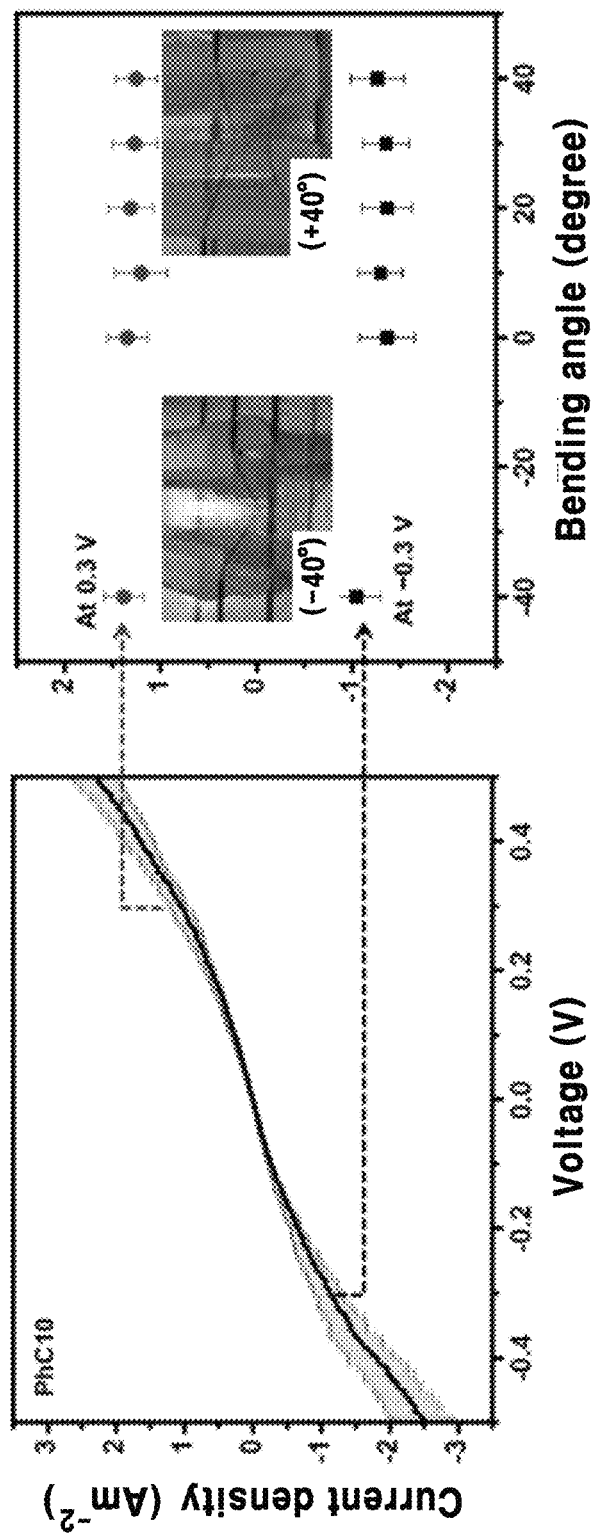
FIG. 12D includes graphs illustrating current density plots for a PhC10 monolayer as a function of a bending angle and current density according to an example embodiment.
Figure 12E:
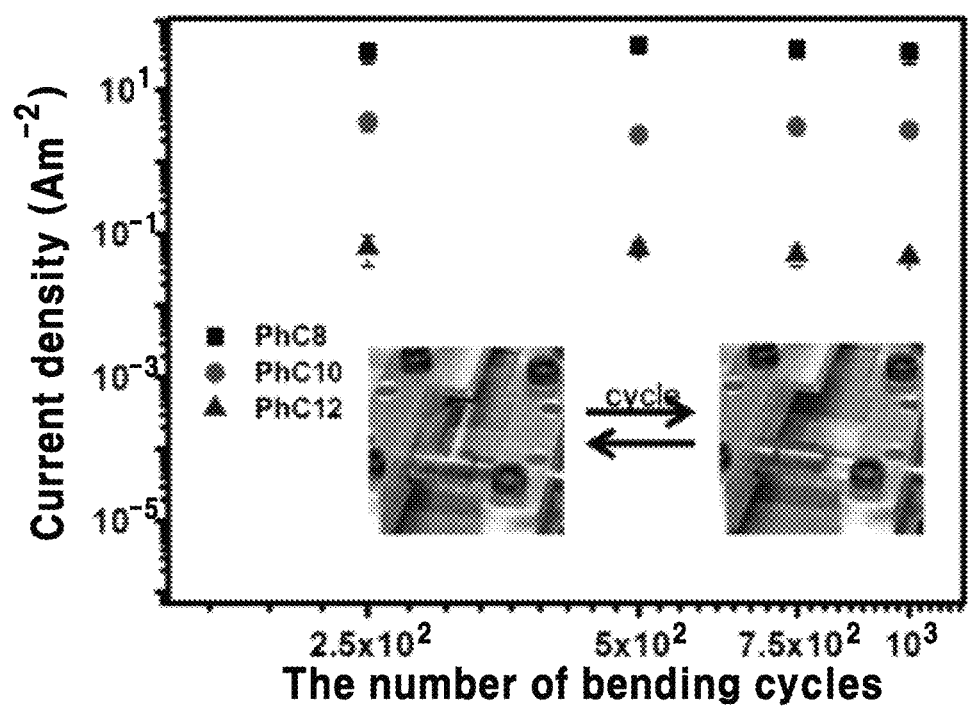
FIG. 12E includes graphs illustrating preservation of the current density at −0.3 V against bending (upper) and twist (lower) cycling, showing the characterization of a graphene-aryl alkane monolayer-graphene device in accordance with an example embodiment.
Figure 12E:
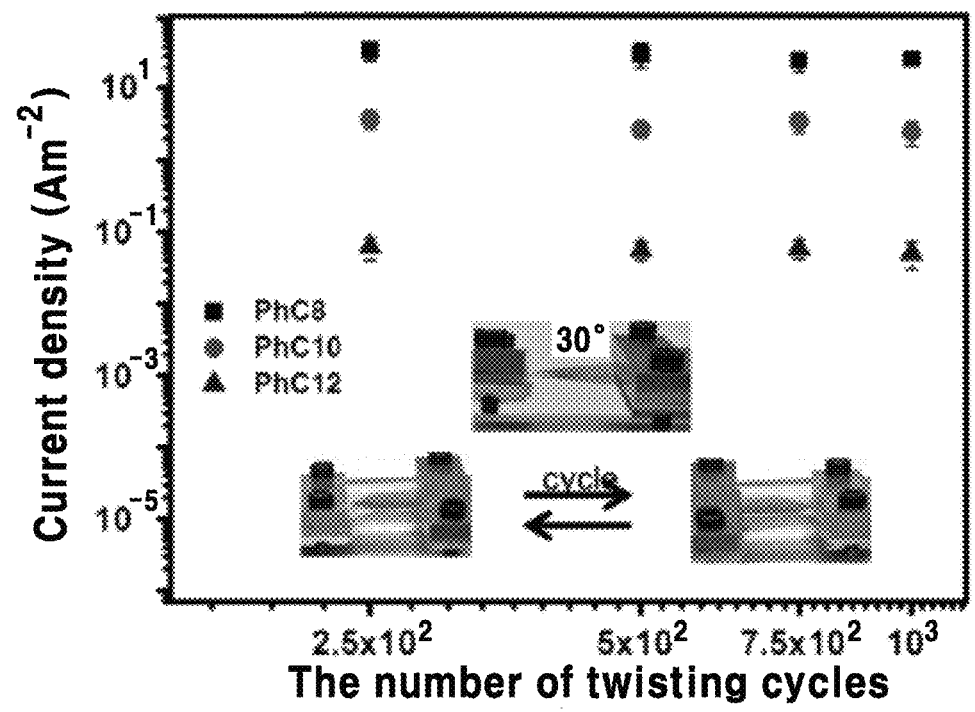

With respect to the characterization of the molecular monolayer of the graphene-aryl alkane monolayer-graphene device in accordance with an example embodiment, FIG. 12A illustrates a schematic view of a transparent and flexible molecular monolayer junction between two graphene electrodes. FIG. 12B illustrates current density-voltage plots on a log scale for each aryl alkane monolayer. The illustration includes an optical image of devices in an array, and the current density plots were generated from average values obtained from over 50 devices. The error bars denote the standard deviations. FIG. 12C illustrates plots of the current density on a log scale at different voltages versus the molecular length in the aryl alkane self-assembled monolayers (SAMs). FIG. 12D illustrates plots of the current density for a PhC10 monolayer as a function of bending angle upon bending the substrate at −40° and setting the current density at −0.3 V to 0.3 V. The illustrations include optical images of the substrates bent at −40° and 40°. FIG. 12E illustrates preservation of the current density at −0.3 V against bending (upper) and twist (lower) cycling. The current density plots were generated from average values obtained from over 15 devices, and the error bars denote the standard deviations. The illustrations include optical images of substrate bending and twisting in a cycle.

Figure 13:
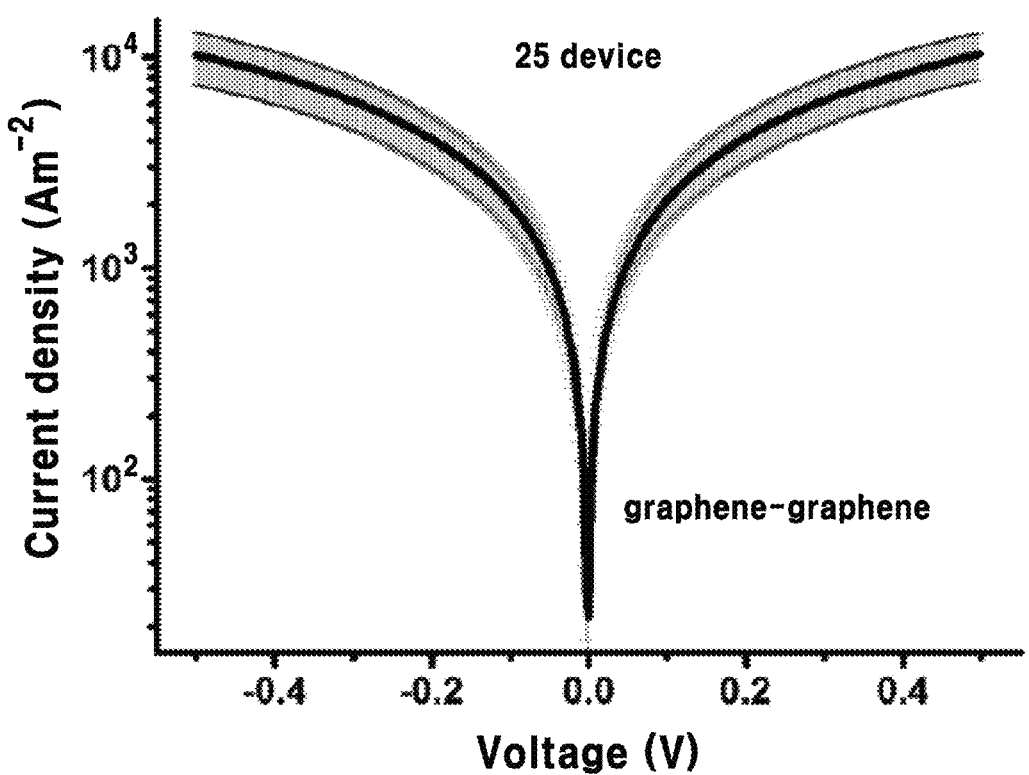
FIG. 13 is a graph illustrating current density as a function of applied voltage for a graphene-graphene device that contains no molecules, as a controlled experiment including a graphene-graphene device in accordance with an example embodiment.

FIG. 12A depicts the fabrication process of the graphene-aryl alkane-graphene vertical junctions and the reason for the stable performances of the graphene-aryl alkane-graphene vertical junctions to mechanical stress. Plots of the electronic characteristics of the devices illustrated in FIG. 12B and FIG. 12C demonstrate that each molecular current density is inversely dependent on the molecular length. As expected, the grafted aryl alkanes (e.g., PhC8, PhC10, and PhC12), a passive component in the circuit, behaved as molecular resistors. The device in accordance with the present Example has the symmetric work function of the top and bottom electrodes with the asymmetric contacts that have one side chemically bound and the other side physical bound. The chemical contacts should have a higher junction conductance than the physical contacts. However, the differences in electrode work function and applied bias more effectively influenced changes in tunneling barrier in molecular junctions, relative to the asymmetric effect of one-side or both-side chemically bound contacts. Therefore, as shown in FIG. 12B, molecular junctions of both one-side or both-side chemically bound contacts with the same electrode material exhibit nearly symmetric current-voltage characteristics. The shortest aryl alkane (PhC8) provided the highest current density among the three aryl alkanes, as shown in FIG. 12B, effectively lowering the current density of the graphene-graphene device without a molecular layer, as shown in FIG. 13. FIG. 13 provides a controlled experiment using the graphene-graphene device in accordance with an example embodiment, and illustrates current density plotted on a log scale as a function of voltage applied to the graphene-graphene device containing no molecules [current density plots were generated from average values from over 25 devices (the error bars denote the standard deviations)]. The current density exponentially decreased as the molecular length of the aryl alkane increased, thus revealing the tunneling mechanism. Current density (J) plots obtained at several biases as a function of the molecular length (d) are described by the expression $J \propto \exp(-\beta d)$, where $\beta$ is the tunneling decay coefficient. The average value $\beta$ obtained is $0.54 \pm 0.01$ Å$^{-1}$, as noted in FIG. 12C, which is lower than that for tunneling transport through the aliphatic alkyl chains in n-alkanethiol/Au junctions. This result confirms that the junction system of graphene-molecule-graphene works reliably to obtain the molecular tunneling transport properties through molecular monolayers. Referring to FIG. 12D, through bending tests, plots of the average current density at low voltages for graphene-PhC10-graphene devices as a function of the strain induced at the external bending angles (−40°~+40° were obtained at −0.3 V to 0.3 V. The graphene-PhC10-graphene devices featuring PhC8 and PhC12 did not exhibit a significant change even at different angles. Furthermore, referring to FIG. 12E, for over 1,000 bending and twisting cycles, almost no change in the current density plots was observed at −0.3 V, which implies excellent device stability to the mechanical stress.

In addition, in photo-switching operation of aryl azobenzene monolayers, molecular photo-switching in a graphene-aryl azobenzene monolayer-graphene junction was characterized by conformational structure-dependent molecular tunneling behaviors, as demonstrated by FIG. 14A to 14D.

Figure 14A:
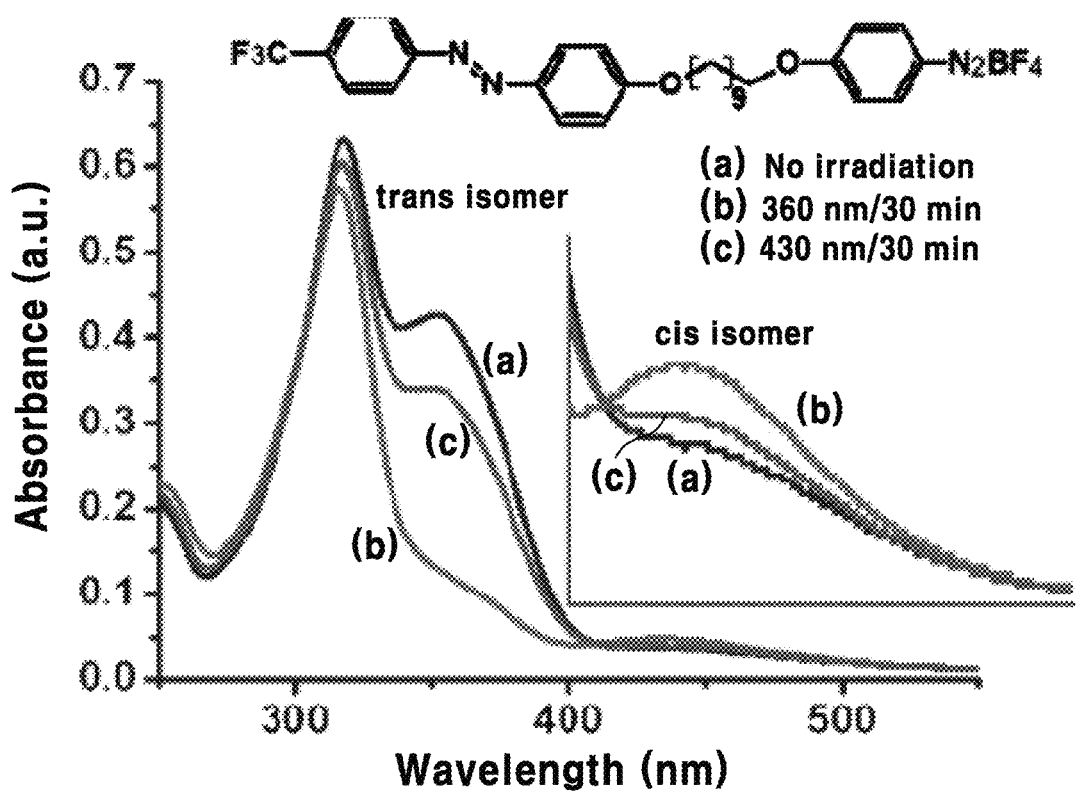
FIG. 14A includes a chemical formula of aryl azobenzene and a UV-Vis spectra of two isomers in solution in exposure to UV/Vis irradiation according to an example embodiment.
Figure 14B:
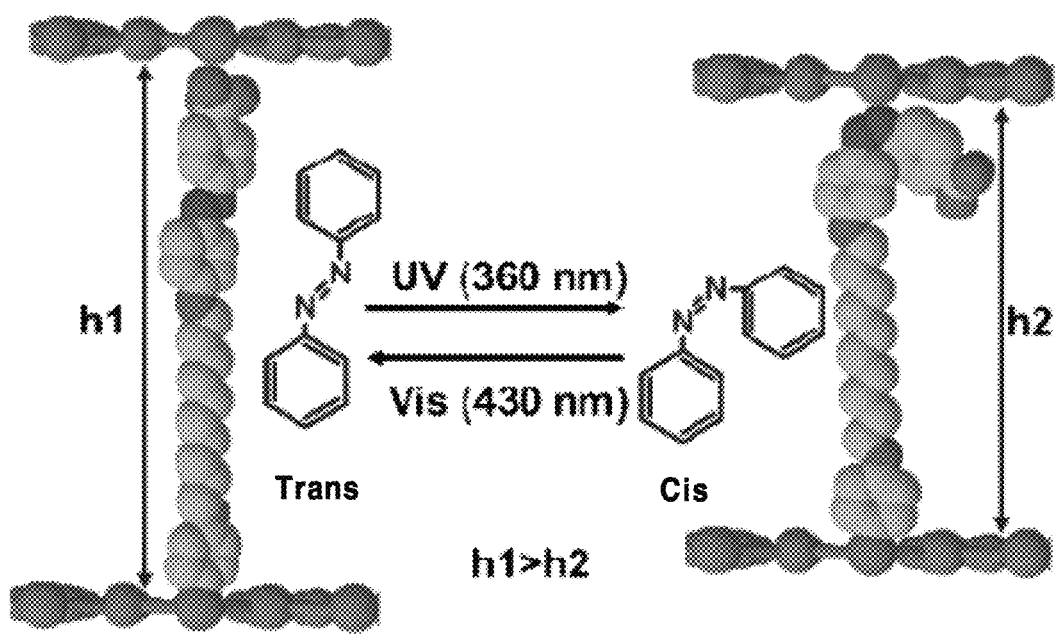
FIG. 14B illustrates mechanism of molecular tunneling barriers that corresponds to a conformational change in the aryl azobenzene molecule in exposure to electromagnetic radiation.
Figure 14C:
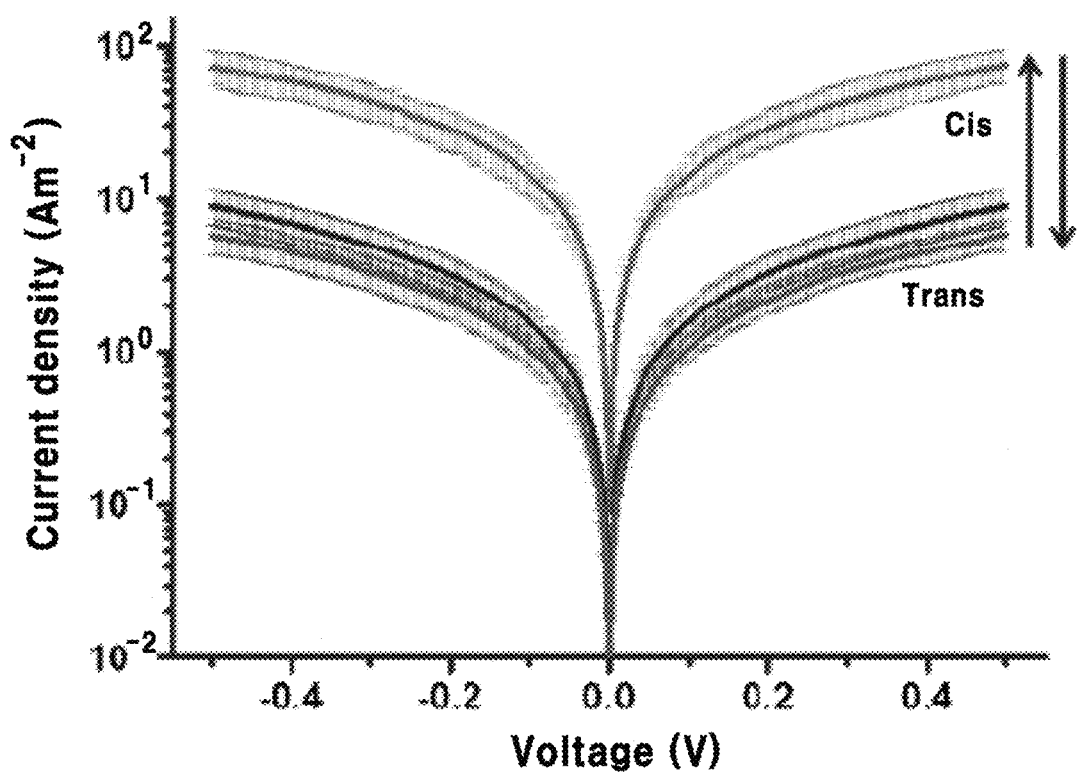
FIG. 14C is a graph illustrating photo-induced current density-voltage plots over a low voltage range for the graphene-aryl azobenzene monolayer-graphene devices according to an example embodiment.
Figure 14D:
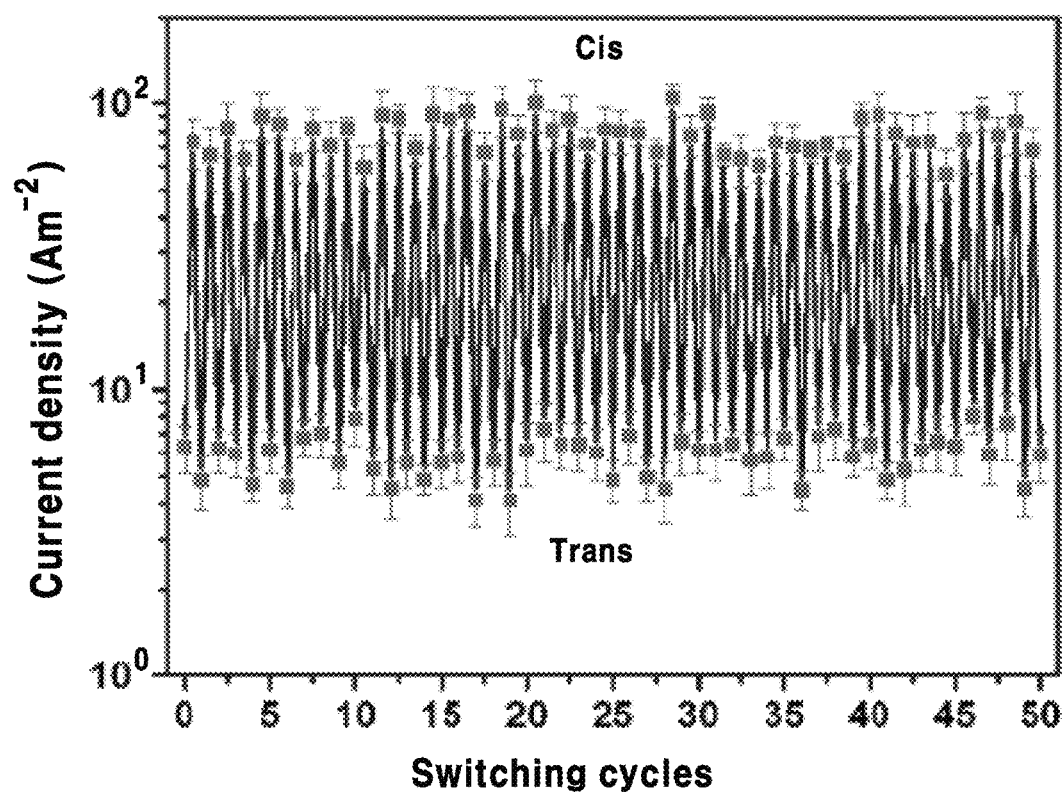
FIG. 14D is a graph illustrating current density plots for each isomer state over at least 50 cycles of reversible photo-switching in an example of a grahene-aryl azobenzene monolayer-graphene device.
Figure 15:
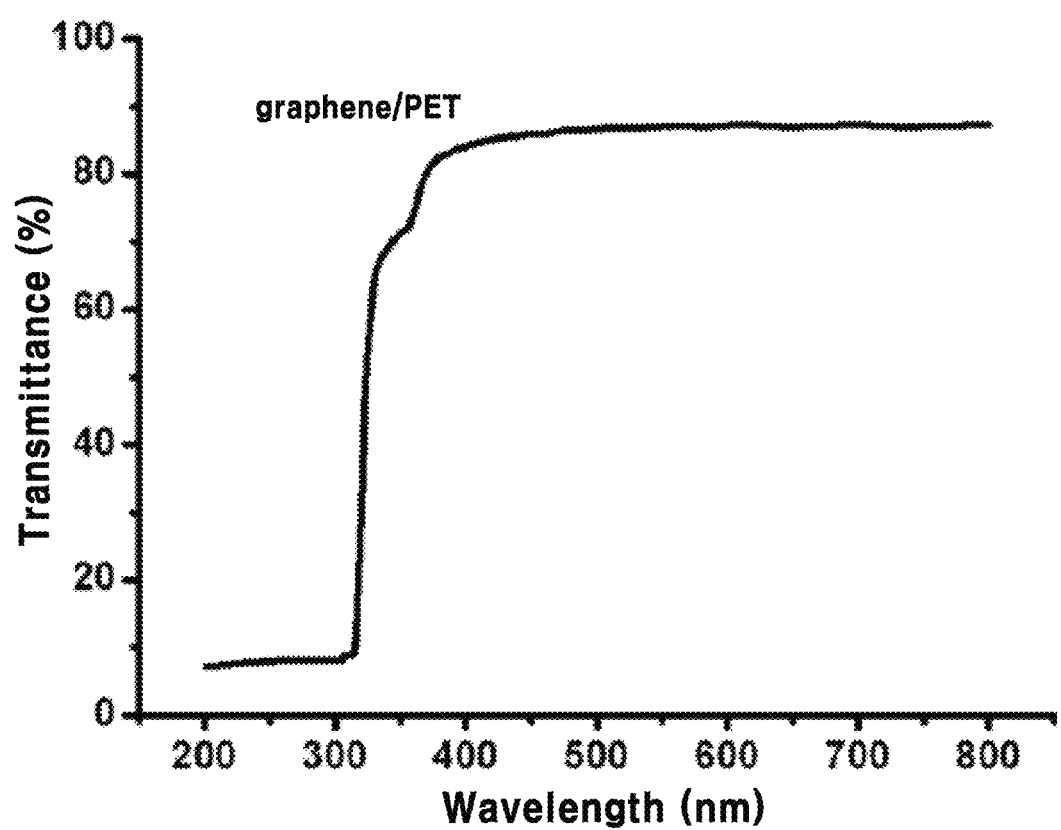
FIG. 15 is a graph illustrating transparency of an example of a graphene/PET substrate. The graph shows transmittance of an example of a graphene-PhC10AB monolayer-graphene device (AB means azobenzene) on a graphene/PET substrate in exposure to UV-irradiation.

FIG. 14A illustrates a chemical structure of aryl azobenzene and UV-Vis spectra in solution regarding UV/Vis irradiation. FIG. 14A also includes a zoomed-in spectra at a range from 400 nm to 550 nm. FIG. 14B illustrates the origin of molecular tunneling barriers (with h1 and h2 being the vertical distance between two graphene electrodes) corresponding to conformational changes in aryl azobenzene molecules with light irradiation. FIG. 14C illustrates photo-induced current density-voltage plots on a log scale over a low voltage range for the graphene-aryl azobenzene monolayer-graphene devices. FIG. 14D illustrates current density plots for each isomer state over 50 cycles of reversible photo-switching (induced by UV/Vis irradiation/45 min). The plots were generated from average values obtained at 0.3 V from over 5 devices, and the error bars denote the standard deviations obtained from over 20 data points for each state. Referring to FIG. 14A, the photo-switching between trans and cis isomers of aryl azobenzene molecules was pretested by UV-Vis spectroscopy. The junction was expected to behave as a molecular switch with light irradiation, by mechanism illustrated in FIG. 14B to FIG. 14D. FIG. 15 is a graph illustrating transparency of an example of a graphene-PhC10AB monolayer-graphene device (AB means azobenzene) on a graphene/PET substrate in exposure to UV-irradiation. The light transmittance is over 80% in the visual spectrum of 390 to 700 nm. Through the transparent graphene top window, as well as through the first graphene window illustrated in FIG. 15, the light-driven structural transformation of aryl azobenzene molecular monolayers was reversibly induced. The present Example found that the photo-switching operation of aryl azobenzene monolayers between two graphene electrodes required longer irradiation time (e.g., 45 min) than that of aryl azobenzene molecules in solution (e.g., 30 min), presumably due to steric hindrance induced by the second graphene electrode even though the physical top contact effectively allow for switching between trans and cis configurations. Current density plots of the aryl azobenzene monolayers (e.g., PhC10AB) in the devices showed two conductance states as a function of UV-Vis irradiation, as illustrated by FIG. 14C and FIG. 14D. The trans isomer in the low conducting state transforms into a cis isomer in the high conducting state, and this process involves short-distance tunneling transport (h1>h2 in FIG. 14b) in cis-aryl azobenzene molecular junctions. In FIG. 14D, the reversible light-induced conformational changes of the aryl azobenzene monolayer were repeatedly plotted as the change in current density with respect to the switching number. Over more than 50 cycles of reversible photo-switching, the two conductance states were almost identical and reproducible, which shows that highly stable photo-switchable molecular monolayer devices were achieved using the novel type of graphene junction.

Figure 16:
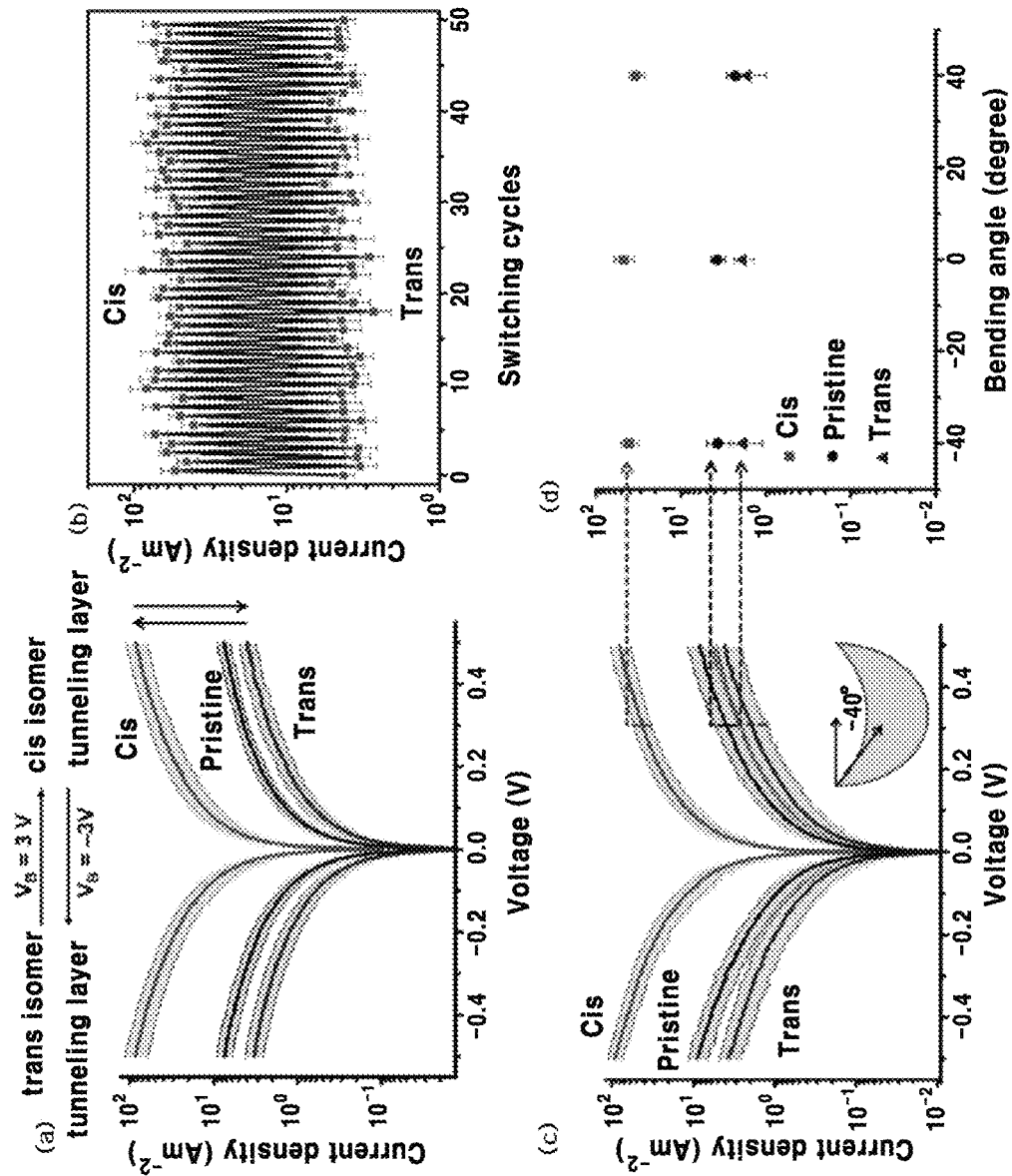
FIG. 16 includes graphs illustrating voltage-induced conductance switching of an example of a PhC10AB device. Graph (a) illustrates a current density-voltage plot for conformational changes between trans and cis isomers without bending of a substrate. Graph (b) illustrates current density plots for each isomer state, as induced by a voltage pulse of 3.0 V/−3.0 V. Graph (c) illustrates a current density-voltage plot for conformational changes between isomers upon bending a substrate) (−40°. Graph (d) illustrates a current density plot obtained from the different bending angles used in graph (c).

FIG. 16 includes a graph showing voltage-induced conductance switching of the PhC10AB device in accordance with an example embodiment. Graph (a) illustrates voltage-induced current density-voltage plots on a log scale over a low voltage range for conformational changes between trans and cis isomers without bending of the substrate [current density plots were generated from average values obtained from over 50 devices (the error bars denote the standard deviations)]. Graph (b) illustrates current density plots for each isomer state in 50 cycles of reversible switching, induced by the voltage pulse of 3.0 V/−3.0 V. The plots were generated from average values obtained from over 5 devices at 0.3 V, and the error bars denote the standard deviations obtained from over 20 data points corresponding to the respective states. Graph (c) illustrates voltage-induced current density-voltage plots on a log scale over a low voltage range for conformational changes between trans and cis isomers upon bending a substrate (−40°). Graph (d) illustrates current density plots obtained at different bending angles from graph (c). The illustration shows a curvature of the substrate, and current density plots were generated from average values obtained from over 15 devices. The error bars denote the standard deviations. In addition to photo-induced conductance switching, applied voltages can induce two molecular conductance states of the aryl azobenzene monolayer. As illustrated in FIG. 16, the voltage pulses of 3.0 V/−3.0 V caused the aryl azobenzene molecules to reversibly transform between the trans isomer and the cis isomer, while the devices featuring aryl alkanes did not show voltage-induced molecular conductance switching at all. For example, the asymmetric junction structure with a chemical bottom contact and a physical top contact can effectively switch between the trans and cis isomer conformations. The preservation test plots of device performances after bending the devices at a certain angle indicated that voltage-driven conformational changes between the both isomers occurred, showing the stability of the flexible molecular electronic devices.

In accordance with the present Example, applications of molecular electronics beyond conventional Si substrate- or metal electrode-based devices to flexible devices could be induced. Like metal electrodes, a graphene electrode served the chemically applicable surface to form molecular monolayers of molecules specified with an electrophillic group (e.g., the dediazoniation process of organic molecules containing diazonium cations on graphene). Graphene, a single layer of carbon atoms forms ideal electrical contacts via formation of carbon-carbon bonding to organic molecules as ultimate materials for flexible electronics. The use of both graphene electrodes in a two-terminal vertical device provides stable contacts to molecular monolayers, leading to high flexibility against mechanical stresses such as bending and twisting. Also molecular devices with two graphene electrodes are electrically stabilized because of a metal-free process for electrical contacts on vulnerable molecular monolayers, preventing an electrical short circuit. High sensitivity of graphene to molecule functionalities gains advantages to realize molecular electronics beyond other electrodes. Moreover, two transparent and conductive graphene electrodes that make one-sided chemically or physically bound contacts to molecules in molecular monolayer devices enables to operate and transmit photo-induced changes in the molecular conformational length of aryl azobenzene molecules.

Self-assembly of aryl molecules on graphene was monitored by nanogravimetry. Molecular monolayer junctions between two graphene electrodes were successfully fabricated and well exhibited tunneling transport through molecular monolayers under the severe influences of bending and twisting. Photo-switchable aryl azobenzene monolayers between highly flexible and transparent graphene electrodes showed a stable device performance with a large number of reversible photo-switching cycles between trans isomer at the low conductance and cis-isomer at the high conductance.

In sum, photo-switchable molecular monolayers between highly flexible and transparent graphene electrodes were prepared. The photo-switchable organic molecules form molecular monolayers on the first graphene electrode, are chemically or physically self-assembled, and are chemically or physically bound with the second graphene electrode. The arrangement of the second graphene electrode/physical bonding/molecular monolayer/chemical bonding/the first graphene electrode provides excellent stability for a transparent and flexible molecular monolayer device.

In accordance with the above-described example embodiments, it is possible to prepare a graphene electrode-molecular thin film hybrid structure including a photo-switchable molecular monolayer, by making flow of currents on/off depending on light by using a photo-switchable compound whose molecular structure is switched by light, as an organic molecular film between highly flexible and transparent graphene electrodes. The photo-switchable molecular monolayer is self-assembled on the first graphene electrode. One side of the photo-switchable molecular monolayer is chemically or physically bonded with the first grahene electrode, and the other side thereof is chemically or physically bonded with the second graphene electrode. The arrangement of the second graphene electrode/physical bonding/molecular monolayer/chemical bonding/the first graphene electrode can provide excellent stability for a transparent and flexible molecular monolayer device. Operation performances of graphene/photo-switching molecular monolayer/graphene devices are stable under severe mechanical stress conditions (e.g., bending and twisting) and a large number of photo-switching cycles.

In accordance with the above-described example embodiments, by providing the monolayer graphene thin film on both the first and second electrodes of the organic molecular device, it is possible to resolve the problem caused from application of conventional metal particles. By using the device, in which both of two electrodes are prepared with graphene, it is possible to achieve superior preparation efficiency, compared to applying graphene to only one electrode.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A structure, comprising: a first electrode comprising graphene disposed on a substrate; a second electrode comprising graphene disposed substantially parallel to the first electrode and separated in space from the first electrode by a molecular monolayer, wherein the first electrode is chemically or physically bonded with one end of the molecular monolayer disposed between the first electrode and the second electrode, and the second electrode is chemically or physically bonded with other end of the molecular monolayer; wherein the molecular monolayer is configured to maintain a voltage applied between the first electrode and the second electrode; wherein the molecular monolayer is configured to induce reversible photo-switching between trans- and cis- conformations of the molecular monolayer in response to UV-vis irradiation; and wherein the molecular monolayer is formed from an organic molecule comprising an aryl diazonium-based cation.

2. The structure of claim 1, wherein the molecular monolayer is chemically or physically bonded with the first electrode via a covalent bond or a physical contact and is chemically or physically bonded with the second electrode via a covalent bond or a physical contact.

3. The structure of claim 1, wherein the aryl diazonium-based cation has a formula of $R-N_{2+}$ or $N_{2+}-R^1-R^2-N_{2+}$, wherein each of R, $R^1$ and $R^2$ independently includes -1-aryl-alkyl, -1-aryl-alkenyl, -1-aryl-alkynyl, -1-aryl-X-alkyl, -1-aryl-X-alkenyl, -1-aryl-X-alkynyl, or -1-aryl; wherein X is O, S or —NH; and, wherein the other end of R of the formula of $R-N_{2+}$ in the aryl diazonium-based cation has a substituent selected from the group consisting of —H, —OH, —NH$_2$, —SH and an azo group.

4. The structure of claim 1, wherein the first electrode or the second electrode comprises a graphene prepared by a chemical vapor deposition, a spin-coating method, or a dipping method, or a reduced graphene oxide prepared by a solution-phase process.

5. A flexible electronic device, comprising the structure according to claim 1.

6. The structure of claim 1, wherein the aryl diazonium-based cation is a member selected from the group consisting of 4-octylbenzenediazonium, 4-decylbenzene-diazonium, 4-dodecylbenzenediazonium, (E)-4-(10-(4-((4-(trifluoromethyl)phenyl) diazenyl)-phenoxy)-decyloxy)benzenediazonium, and combinations thereof.

7. The structure of claim 1, wherein the molecular monolayer is bonded with the first electrode via a covalent bond and is bonded with the second electrode via a physical contact.

8. The structure of claim 1, wherein the first electrode is a single layer graphene and the second electrode is a single-layer graphene.

9. The structure of claim 1, wherein the voltage is between –3.0 V to 3.0 V.

10. The structure of claim 1, wherein the voltage is between –0.5 V to 0.5 V.

11. The structure of claim 1, wherein the voltage is between –0.3 V to 0.3 V.

12. The structure of claim 1, further comprising a first gold (Au) metal lead connected to the first electrode and a second gold (Au) metal lead connected to the second electrode.

13. A vertical molecular tunneling device, comprising: a substrate layer, a first graphene layer, a tunnel junction layer, and a second graphene layer, disposed in this order; wherein the tunnel junction layer comprises a monolayer of molecules, which are bonded chemically or physically to the first graphene layer at one end and which are bonded chemically or physically to the second graphene layer at the other end, that is effective to form molecular junctions between the first graphene layer and the second graphene layer without electrical shorting, and wherein the monolayer of molecules is formed from an organic molecule comprising an aryl diazonium-based cation.

14. The vertical molecular tunneling device of claim 13, wherein the thickness of the monolayer is from about 1.5 nm to about 2.0 nm.

15. The vertical molecular tunneling device of claim 13, wherein the monolayer of molecules comprises an aryl diazonium-based cation and the molecular length of the molecules is from about 1.5 nm to about 2.0 nm.

16. The vertical molecular tunneling device of claim 13, wherein the bonds between (i) the monolayer and (ii) the first graphene layer or the second graphene layer are effective to increase the lattice constant of the first graphene layer or the lattice constant of the second graphene layer, respectively, to at least about 2.51 Å.

17. The vertical molecular tunneling device of claim 13, wherein the substrate layer, the first graphene layer, the tunnel junction layer, and the second graphene layer are configured to induce reversible photo-switching between trans- and cis- conformations of the monolayer of molecules in response to UV-vis irradiation.

18. The vertical molecular tunneling device of claim 13, wherein the vertical molecular tunneling device has a plurality of conductance states as a function of UV-vis irradiation.

19. The vertical molecular tunneling device of claim 13, wherein the vertical molecular tunneling device has a plurality of conductance states as a function of electric potential difference applied across the first and second graphene layers. .

* * * * *